(12) United States Patent
Yamazaki et al.

(10) Patent No.: US 9,848,070 B2
(45) Date of Patent: Dec. 19, 2017

(54) LIGHT-EMITTING DEVICE HAVING BENT END PORTIONS

(71) Applicant: Semiconductor Energy Laboratory Co., Ltd., Atsugi-shi, Kanagawa-ken (JP)

(72) Inventors: Shunpei Yamazaki, Setagaya (JP); Yoshiharu Hirakata, Ebina (JP); Tomoya Aoyama, Atsugi (JP); Akihiro Chida, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/164,057

(22) Filed: May 25, 2016

(65) Prior Publication Data

US 2016/0269515 A1     Sep. 15, 2016

Related U.S. Application Data

(63) Continuation of application No. 14/247,616, filed on Apr. 8, 2014, now Pat. No. 9,406,898.

(30) Foreign Application Priority Data

Apr. 15, 2013  (JP) ................... 2013-084528
Oct. 21, 2013  (JP) ................... 2013-218603

(51) Int. Cl.
*H01L 27/32*    (2006.01)
*H01L 51/00*    (2006.01)
(Continued)

(52) U.S. Cl.
CPC ........ *H04M 1/0266* (2013.01); *G06F 3/0412* (2013.01); *H01L 27/323* (2013.01);
(Continued)

(58) Field of Classification Search
CPC . H01L 27/323; H01L 27/3276; H01L 51/003; H01L 51/0097; H01L 51/5012;
(Continued)

(56) References Cited

U.S. PATENT DOCUMENTS 5,357,061 A    10/1994   Crutchfield
5,776,797 A    7/1998    Nicewarner, Jr. et al.
(Continued)

FOREIGN PATENT DOCUMENTS

CN     101661999 A    3/2010
CN     101996535 A    3/2011
(Continued)

OTHER PUBLICATIONS

International Search Report (Application No. PCT/JP2014/059790) Dated May 13, 2014.
(Continued)

*Primary Examiner* — Ida M Soward
(74) *Attorney, Agent, or Firm* — Robinson Intellectual Property Law Office; Eric J. Robinson

(57) ABSTRACT

A light-emitting device or a display device that is less likely to be broken is provided. Provided is a light-emitting device including an element layer and a substrate over the element layer. At least a part of the substrate is bent to the element layer side. The substrate has a light-transmitting property and a refractive index that is higher than that of the air. The element layer includes a light-emitting element that emits light toward the substrate side. Alternatively, provided is a light-emitting device including an element layer and a substrate covering a top surface and at least one side surface of the element layer. The substrate has a light-transmitting property and a refractive index that is higher than that of the air. The element layer includes a light-emitting element that emits light toward the substrate side.

22 Claims, 17 Drawing Sheets

(51) Int. Cl.

| | |
|---|---|
| *H01L 51/52* | (2006.01) |
| *H04M 1/02* | (2006.01) |
| *H04B 1/38* | (2015.01) |
| *G06F 3/00* | (2006.01) |
| *H01L 51/50* | (2006.01) |
| *G06F 3/041* | (2006.01) |
| *H04B 1/3888* | (2015.01) |

(52) U.S. Cl.
CPC ........ *H01L 27/3276* (2013.01); *H01L 51/003* (2013.01); *H01L 51/0097* (2013.01); *H01L 51/5012* (2013.01); *H01L 51/524* (2013.01); *H01L 51/5237* (2013.01); *H01L 51/5253* (2013.01); *H04B 1/3888* (2013.01); *G06F 2203/04103* (2013.01); *H01L 27/3227* (2013.01); *H01L 2227/323* (2013.01); *H01L 2251/5338* (2013.01); *Y02E 10/549* (2013.01)

(58) Field of Classification Search
CPC ............... H01L 51/5237; H01L 51/524; H01L 51/5253; H04M 1/0266; H04B 1/3888; G06F 3/0412
See application file for complete search history.

(56) References Cited

U.S. PATENT DOCUMENTS

| | | | |
|---|---|---|---|
| 6,035,180 | A | 3/2000 | Kubes et al. |
| 6,841,855 | B2 | 1/2005 | Jaeck et al. |
| 6,903,794 | B2 | 6/2005 | Fukuta et al. |
| 7,115,980 | B2 | 10/2006 | Miyagawa et al. |
| 7,593,234 | B2 | 9/2009 | Okuda |
| 8,130,484 | B2 | 3/2012 | Koga et al. |
| 8,384,840 | B2 | 2/2013 | Mishima |
| 8,405,193 | B2 | 3/2013 | Schaepkens et al. |
| 8,415,208 | B2 | 4/2013 | Takayama et al. |
| 8,497,951 | B2 | 7/2013 | Kobayashi |
| 8,516,728 | B2 | 8/2013 | Jung |
| 8,576,209 | B2 | 11/2013 | Miyaguchi |
| 8,593,061 | B2 | 11/2013 | Yamada |
| 8,610,118 | B2 | 12/2013 | Yamazaki et al. |
| 8,610,155 | B2 | 12/2013 | Hatano et al. |
| 8,698,776 | B2 | 4/2014 | Kurashima |
| 8,724,038 | B2 * | 5/2014 | Ganapathi .......... G02B 26/0833 345/173 |
| 8,861,205 | B2 | 10/2014 | Lee |
| 8,911,653 | B2 * | 12/2014 | Yamazaki ............ H01L 51/0097 264/272.17 |
| 9,368,541 | B2 * | 6/2016 | Kurokawa |
| 9,504,124 | B2 * | 11/2016 | Kim ..................... G06F 1/1637 |
| 2002/0050641 | A1 | 5/2002 | Freeman |
| 2003/0027369 | A1 | 2/2003 | Yamazaki |
| 2003/0154680 | A1 | 8/2003 | Dinwoodie |
| 2003/0201974 | A1 | 10/2003 | Yin |
| 2006/0286717 | A1 | 12/2006 | Solberg et al. |
| 2010/0039706 | A1 | 2/2010 | Danner et al. |
| 2010/0052503 | A1 | 3/2010 | Fukagawa |
| 2010/0253902 | A1 * | 10/2010 | Yamazaki ............ G02F 1/1303 349/158 |
| 2010/0317409 | A1 | 12/2010 | Jiang et al. |
| 2011/0115364 | A1 | 5/2011 | Kim |
| 2011/0134056 | A1 | 6/2011 | Kim et al. |
| 2013/0002133 | A1 | 1/2013 | Jin et al. |
| 2013/0002583 | A1 | 1/2013 | Jin et al. |
| 2013/0021768 | A1 | 1/2013 | Kim et al. |
| 2013/0075732 | A1 * | 3/2013 | Saito .................... H01L 29/7869 257/57 |
| 2013/0180882 | A1 | 7/2013 | Hamers et al. |
| 2013/0194761 | A1 | 8/2013 | Kim |
| 2014/0042406 | A1 | 2/2014 | Degner et al. |
| 2014/0099999 | A1 | 4/2014 | Hatano et al. |
| 2014/0217382 | A1 | 8/2014 | Kwon et al. |
| 2014/0240985 | A1 | 8/2014 | Kim et al. |
| 2015/0053959 | A1 | 2/2015 | Yamazaki et al. |
| 2016/0020196 | A1 * | 1/2016 | Jung ................ H01L 23/49827 257/40 |

FOREIGN PATENT DOCUMENTS

| | | |
|---|---|---|
| CN | 102855821 A | 1/2013 |
| CN | 102855822 A | 1/2013 |
| CN | 202816269 U | 3/2013 |
| DE | 102012211232 | 1/2013 |
| EP | 2541371 A | 1/2013 |
| JP | 2001-519585 | 10/2001 |
| JP | 2002-297066 A | 10/2002 |
| JP | 2002-366059 A | 12/2002 |
| JP | 2003-174153 A | 6/2003 |
| JP | 2003-345286 A | 12/2003 |
| JP | 2006-005712 A | 1/2006 |
| JP | 2007-326259 A | 12/2007 |
| JP | 2010-055918 A | 3/2010 |
| JP | 2011-003537 A | 1/2011 |
| JP | 2011-026558 A | 2/2011 |
| JP | 2012-138212 A | 7/2012 |
| JP | 2013-015835 A | 1/2013 |
| KR | 2013-0007311 A | 1/2013 |
| KR | 2014-0117824 A | 10/2014 |
| TW | 201311066 | 3/2013 |
| WO | WO-99/18590 | 4/1999 |

OTHER PUBLICATIONS

Written Opinion (Application No. PCT/JP2014/059790) Dated May 13, 2014.

Chinese Office Action (Application No. 201480022069.2) Dated Aug. 30, 2016.

* cited by examiner

LIGHT-EMITTING DEVICE HAVING BENT END PORTIONS

TECHNICAL FIELD

The present invention relates to a light-emitting device, a display device, an electronic device, a lighting device, or a manufacturing method thereof. In particular, the present invention relates to a light-emitting device, a display device, an electronic device, or a lighting device utilizing electroluminescence (EL) or a manufacturing method thereof.

BACKGROUND ART

Recent light-emitting devices and display devices are expected to be applied to a variety of uses and become diversified.

For example, light-emitting devices and display devices for mobile devices and the like are required to be thin, lightweight, and less likely to be broken. In view of production of high-performance and high value-added light-emitting devices and display devices, there are also demands for light-emitting devices and display devices capable of touch operation.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been proposed.

For example, Patent Document 1 discloses a flexible active matrix light-emitting device in which an organic EL element and a transistor serving as a switching element are provided over a film substrate.

PATENT DOCUMENT

[Patent Document 1] Japanese Published Patent Application No. 2003-174153

DISCLOSURE OF INVENTION

An object of one embodiment of the present invention is to provide a novel light-emitting device, display device, electronic device, or lighting device. Another object of one embodiment of the present invention is to provide a lightweight light-emitting device, display device, electronic device, or lighting device. Another object of one embodiment of the present invention is to provide a highly reliable light-emitting device, display device, electronic device, or lighting device. Another object of one embodiment of the present invention is to provide a light-emitting device, display device, electronic device, or lighting device that is less likely to be broken. Another object of one embodiment of the present invention is to provide a thin light-emitting device, display device, electronic device, or lighting device. Another object of one embodiment of the present invention is to provide a light-emitting device, display device, electronic device, or lighting device with high light extraction efficiency. Another object of one embodiment of the present invention is to provide a light-emitting device, display device, electronic device, or lighting device with low power consumption.

In one embodiment of the present invention, there is no need to achieve all the above objects.

One embodiment of the present invention is a light-emitting device including an element layer and a substrate over the element layer. At least a part of the substrate is bent to the element layer side. The substrate has a light-transmitting property and a refractive index that is higher than that of the air. The element layer includes a light-emitting element that emits light toward the substrate side.

In the above structure, it is preferable that at least a part of the element layer overlap with and be bent in the same direction as a portion of the substrate that is bent to the element layer side.

Another embodiment of the present invention is a light-emitting device including an element layer and a substrate covering a top surface and at least one side surface of the element layer. The substrate has a light-transmitting property and a refractive index that is higher than that of the air. The element layer includes a light-emitting element that emits light toward the substrate side.

Each of the above structures preferably includes a bonding layer between the element layer and the substrate, and the bonding layer preferably has a light-transmitting property and a refractive index that is higher than that of the air. In that case, the bonding layer preferably includes a resin and a particle having a refractive index different from that of the resin.

In each of the above structures, the element layer preferably includes a touch sensor.

In each of the above structures, the substrate preferably includes an organic resin. Using an organic resin, not glass, for the substrate makes it possible to provide a light-emitting device that is lightweight and less likely to be broken.

One embodiment of the present invention is a light-emitting device that includes an element layer including a first substrate, a first bonding layer over the first substrate, and a light-emitting element over the first bonding layer; a second bonding layer over the element layer; and a second substrate over the second bonding layer. At least part of the second substrate is bent to the element layer side. The second bonding layer and the second substrate each have a light-transmitting property and a refractive index higher than that of the air. The light-emitting element emits light toward the second substrate side.

Another embodiment of the present invention is a light-emitting device that includes an element layer including a first substrate, a first bonding layer over the first substrate, and a light-emitting element over the first bonding layer; a second substrate covering the top surface and at least one side surface of the element layer; and a second bonding layer between the element layer and the second substrate. The second bonding layer and the second substrate each have a light-transmitting property and a refractive index higher than that of the air. The light-emitting element emits light toward the second substrate side.

In each of the above structures, the element layer preferably includes a light-receiving element, a light-blocking layer that is closer to the first substrate than is the light-receiving element and overlaps with the light-receiving element, and a sealing layer between the light-blocking layer and the light-emitting element. The sealing layer preferably has a refractive index higher than that of the air.

Another embodiment of the present invention is a light-emitting device including a first substrate, a light-emitting element over the first substrate, a second substrate with a light-transmitting property, a light-blocking layer over the second substrate, a light-receiving element that is between the second substrate and the light-blocking layer and overlaps with the light-blocking layer, and a bonding layer formed in a frame shape between the first substrate and the second substrate to surround the light-emitting element and the light-receiving element. A surface of the first substrate over which the light-emitting element is formed and a surface of the second substrate over which the light-receiving element is formed face each other. The light-emitting element emits light toward the second substrate side.

Another embodiment of the present invention is a light-emitting device that includes an element layer including a first substrate, a first bonding layer over the first substrate, a light-emitting element over the first bonding layer, a sealing layer over the light-emitting element, a light-blocking layer over the sealing layer, and a light-receiving element over the light-blocking layer; a second substrate covering the top surface and at least one side surface of the element layer; and a second bonding layer between the element layer and the second substrate. The sealing layer, the second bonding layer, and the second substrate each have a light-transmitting property and a refractive index higher than that of the air. The light-emitting element emits light toward the second substrate side.

In each of the above structures, a coloring layer overlapping with the light-emitting element is preferably provided between the sealing layer and the second substrate.

In each of the above structures, the sealing layer preferably includes a resin and a particle having a refractive index different from that of the resin.

Embodiments of the present invention also include an electronic device including the above light-emitting device in a display portion and a lighting device including the above light-emitting device in a light-emitting portion.

Note that the light-emitting device in this specification includes, in its category, a display device using a light-emitting element. Further, the category of the light-emitting device in this specification includes a module in which a light-emitting element is provided with a connector such as an anisotropic conductive film or a TCP (tape carrier package); a module having a TCP at the tip of which a printed wiring board is provided; and a module in which an IC (integrated circuit) is directly mounted on a light-emitting element by a COG (chip on glass) method. Furthermore, the category includes a light-emitting device which is used in lighting equipment or the like.

In one embodiment of the present invention, a novel light-emitting device, display device, electronic device, or lighting device can be provided. In one embodiment of the present invention, a lightweight light-emitting device, display device, electronic device, or lighting device can be provided. In one embodiment of the present invention, a highly reliable light-emitting device, display device, electronic device, or lighting device can be provided. In one embodiment of the present invention, a light-emitting device, display device, electronic device, or lighting device that is less likely to be broken can be provided. In one embodiment of the present invention, a thin light-emitting device, display device, electronic device, or lighting device can be provided. In one embodiment of the present invention, a light-emitting device, display device, electronic device, or lighting device with high light extraction efficiency can be provided. In one embodiment of the present invention, a light-emitting device, display device, electronic device, or lighting device with low power consumption can be provided.

BEST MODE FOR CARRYING OUT THE INVENTION

Figure 1A:
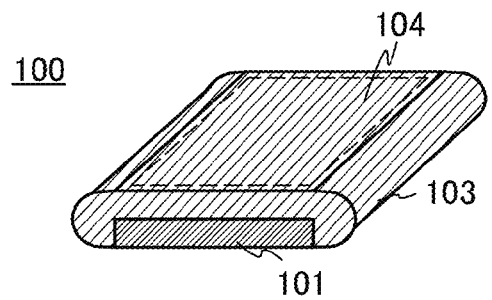
FIGS. 1A to 1D illustrate examples of a light-emitting device of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

In this embodiment, light-emitting devices of embodiments of the present invention will be described with reference to FIGS. 1A to 1D and FIGS. 2A to 2G.

A light-emitting device of one embodiment of the present invention includes an element layer and a substrate over the element layer. At least a part of the substrate is bent to the element layer side. The substrate has a light-transmitting property and a refractive index that is higher than that of the air. The element layer includes a light-emitting element that emits light toward the substrate side.

In one embodiment of the present invention, at least part of the substrate on the light extraction side of the light-emitting device is bent to the element layer side; thus, the light-emitting device is less likely to be broken. There is no particular limitation on the area or the position of a region of the substrate that is bent to the element layer side, and a bend line may be at the center of the substrate.

Structural Example 1

A light-emitting device 100 shown in FIG. 1A includes an element layer 101 and a substrate 103 over the element layer 101.

In each of the light-emitting devices described in this embodiment, the element layer 101 includes a light-emitting element that emits light toward the substrate 103 side. In each of the light-emitting devices described in this embodiment, light emitted from the light-emitting element included in the element layer 101 is extracted from a light extraction portion 104 through the substrate 103.

In the light-emitting device 100 in FIG. 1A, at least part of the substrate 103 is bent to the element layer 101 side. Specifically, an end portion of the substrate 103 is bent to the element layer 101 side. Here, an "end portion of A" refers to a region including at least a side surface of A, and further may include the light extraction portion of the light-emitting device. Although end portions including two opposing side surfaces of the substrate 103 are bent to the element layer 101 side here, one embodiment of the present invention is not limited thereto. In addition, although the bend line is parallel to a side of the substrate here, one embodiment of the present invention is not limited thereto. In other words, the bend line may be parallel to any side of the substrate (either a long side or a short side). Further, the bend line is not necessarily parallel to a side of the substrate.

Structural Example 2

Figure 1B:
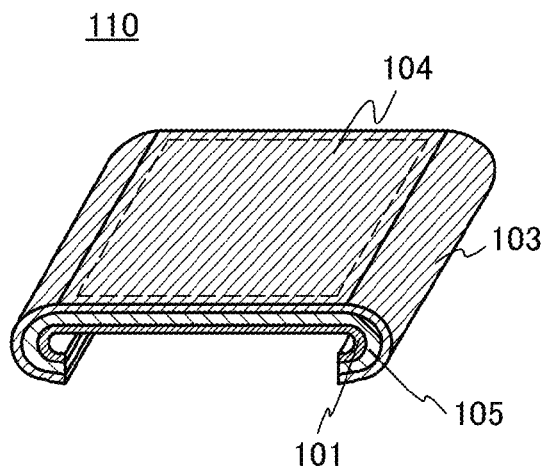

A light-emitting device 110 shown in FIG. 1B includes the element layer 101, the substrate 103 over the element layer 101, and a bonding layer 105 between the element layer 101 and the substrate 103.

At least part of the substrate 103 is bent to the element layer 101 side. Further, at least part of the element layer 101 overlaps with and is bent in the same direction as a portion of the substrate 103 that is bent to the element layer 101 side. In other words, and end portion of the substrate 103 and an end portion of the element layer 101 are bent to the side opposite to the light extraction side of the light-emitting device 110.

Structural Example 3

Figure 1C:
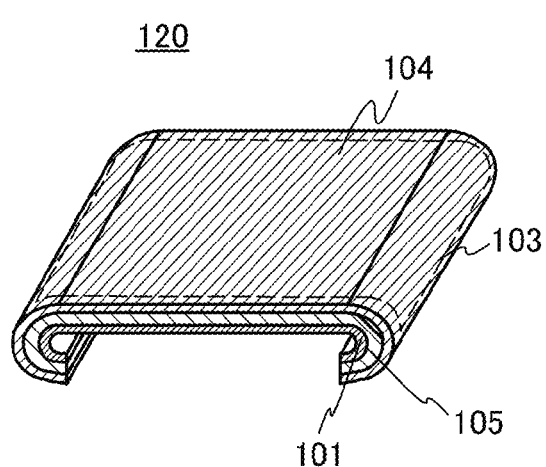

A light-emitting device 120 shown in FIG. 1C is the same as the light-emitting device 110 in FIG. 1B except for the structure of the light extraction portion 104. Although only a non-light-emitting portion of the element layer 101 is bent in the light-emitting device 110, a light-emitting portion of the element layer 101 may partly be bent as in the light-emitting device 120. It can be said that the light extraction portion 104 of the light-emitting device 120 includes a curved surface.

Structural Example 4

Figure 1D:
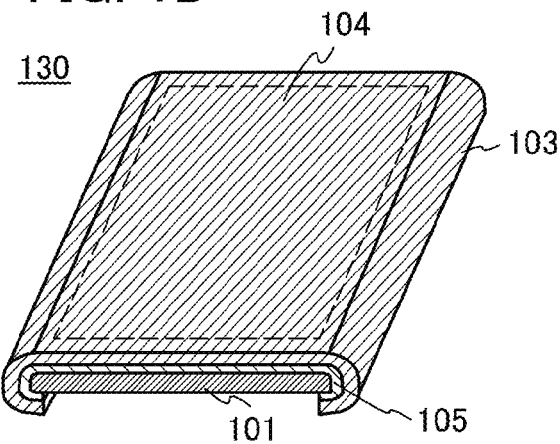

A light-emitting device 130 shown in FIG. 1D includes the element layer 101, the substrate 103 covering the top surface and at least one side surface of the element layer 101, and the bonding layer 105 between the element layer 101 and the substrate 103.

At least part of the substrate 103 is bent to the element layer 101 side and covers at least part of two side surfaces of the element layer 101. The substrate 103 may cover part of the bottom surface of the element layer 101 (the surface opposite to the light-emitting surface of the element layer).

In each of Structural Examples 1 to 4 of light-emitting devices, at least part of the substrate 103 on the light extraction side of the light-emitting device is bent to the element layer 101 side, which makes the light-emitting device less likely to be broken.

Application Examples 1 to 4 that can be applied to the above structural examples of light-emitting devices are described below.

Application Example 1

Figure 2A:
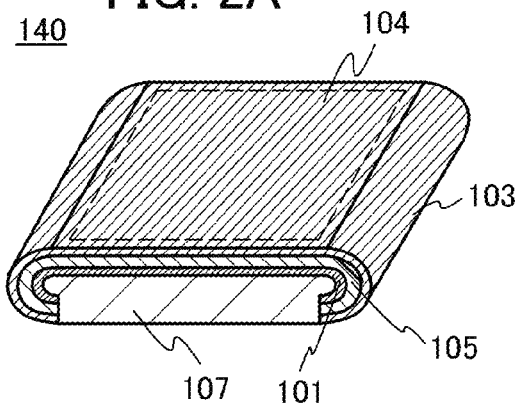
FIGS. 2A to 2G illustrate examples of a light-emitting device of one embodiment of the present invention.

A light-emitting device 140 shown in FIG. 2A is the same as the light-emitting device 110 in FIG. 1B except that an insulator 107 is provided. A light-emitting device of one embodiment of the present invention includes the insulator 107 on the bottom surface side of the element layer 101 (the side opposite to the light extraction side of the light-emitting device). For example, in the case where a conductive layer is exposed to the air at the bottom surface of the element layer 101, the insulator 107 can be provided to electrically insulate the light-emitting device of one embodiment of the present invention from another device. The insulator 107 preferably covers side surfaces of the element layer 101, the substrate 103, and the bonding layer 105 so that these side surfaces are not exposed to the air. Thus, an impurity such as water can be prevented from entering the light-emitting device.

Application Example 2

Figure 2B:
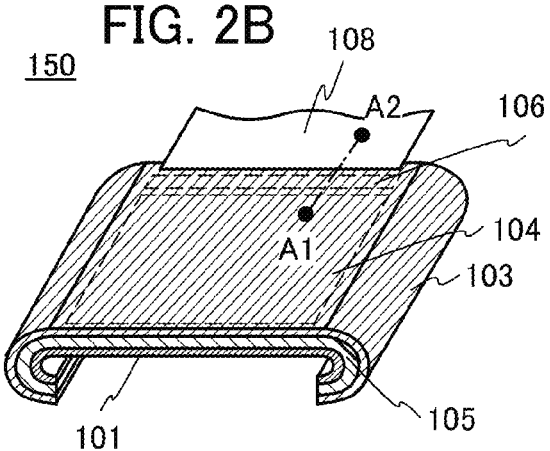

A light-emitting device 150 shown in FIG. 2B includes one driver circuit portion 106 and one flexible printed circuit (FPC) 108. Although the FPC 108 is provided on the substrate 103 side here, the FPC 108 may be provided on the element layer 101 side. The light-emitting device 150 is the same as the light-emitting device 110 in FIG. 1B except that the driver circuit portion 106 and the FPC 108 are provided.

Application Example 3

Figure 2C:
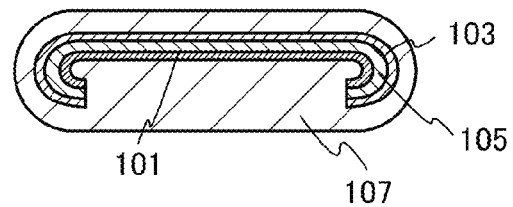
Figure 2D:
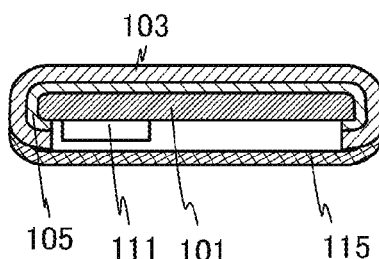

In one embodiment of the present invention, the insulator 107 may cover the substrate 103 on the light extraction side of the light-emitting device (FIG. 2C). This structure reduces damage to the light extraction surface of the light-emitting device and, further, prevents an element included in the element layer 101 from being broken. Moreover, the insulator 107 covers side surfaces of the substrate 103 and the element layer 101 that are bent to the side opposite to the light extraction side of the light-emitting device. Thus, an impurity such as water can be prevented from entering the light-emitting device. With such a structure, a highly reliable light-emitting device that is less likely to be broken can be provided.

Application Example 4

In one embodiment of the present invention, a power storage device 111 may be placed on the bottom surface side of the element layer 101 (the side opposite to the light extraction side of the light-emitting device) and a protective layer 115 may be provided to cover the power storage device 111.

Figure 2E:
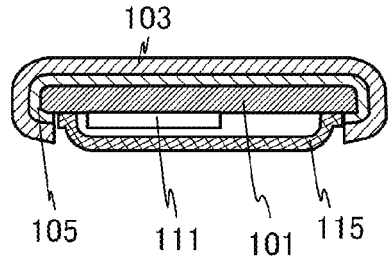
Figure 2F:
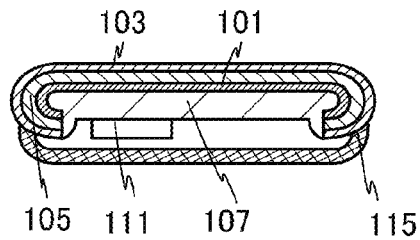
Figure 2G:
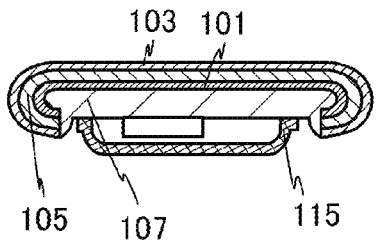

An end portion of the protective layer 115 may overlap with a portion of the substrate 103 that is bent to the element layer 101 side (FIG. 2D) or overlap with the element layer 101 without any part of the substrate 103 positioned therebetween (FIG. 2E). Further, as shown in FIG. 2F, the insulator 107 may be provided between the element layer 101 and the power storage device 111. As shown in FIG. 2G, an end portion of the protective layer 115 may overlap with the insulator 107 without any part of the substrate 103 positioned therebetween.

In such cases, the FPC on the substrate 103 side or the element layer 101 side may be bent to be partly positioned between the element layer 101 and the protective layer 115.

In addition, a light-emitting device of one embodiment of the present invention may be capable of touch operation. A touch sensor of any of various types such as a resistive type, a capacitive type, an infrared ray type, an optical type, an electromagnetic induction type, and a surface acoustic wave type can be used. In one embodiment of the present invention, the element layer 101 can be provided with a touch sensor without an increase in the number of substrates included in the light-emitting device. This is preferable because the light-emitting device can be thin and lightweight.

Note that it is preferable that the minimum curvature radius in a region of the substrate 103 that is bent to the element layer 101 side be greater than or equal to 1 mm and less than or equal to 150 mm, preferably greater than or equal to 1 mm and less than or equal to 100 mm, further preferably greater than or equal to 1 mm and less than or equal to 50 mm, and particularly preferably greater than or equal to 2 mm and less than or equal to 5 mm. Further, it is preferable that the minimum curvature radius in a region of the element layer 101 that is bent in the same direction as the substrate 103 be greater than or equal to 1 mm and less than or equal to 150 mm, preferably greater than or equal to 1 mm and less than or equal to 100 mm, further preferably greater than or equal to 1 mm and less than or equal to 50 mm, and particularly preferably greater than or equal to 2 mm and less than or equal to 5 mm. A light-emitting device of one embodiment of the present invention is free from breakage of an element even when bent with a small curvature radius (e.g., greater than or equal to 2 mm and less than or equal to 5 mm) and has high reliability. Bending with a small curvature radius makes it possible to provide a thin light-emitting device. Bending the light extraction portion 104 with a large curvature radius (e.g., greater than or equal to 5 mm and less than or equal to 100 mm) can provide a large display portion (light-emitting portion) on a side surface of a light-emitting device.

<Examples of Materials>

Next, materials and the like that can be used for a light-emitting device of one embodiment of the present invention are described.

The element layer 101 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 101 may further include a transistor for driving the light-emitting element, a touch sensor, or the like.

In the element layer 101, the light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

The substrate 103 has a light-transmitting property and transmits at least light emitted from the light-emitting element included in the element layer 101. The substrate 103 may be a flexible substrate. The refractive index of the substrate 103 is higher than that of the air.

An organic resin, which has a specific gravity smaller than that of glass, is preferably used for the substrate 103, in which case the light-emitting device can be more lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 103 may have a stacked structure of a layer of any of the above-mentioned materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film with low water permeability may be included in the stacked structure.

The bonding layer 105 has a light-transmitting property and transmits at least light emitted from the light-emitting element included in the element layer 101. The refractive index of the bonding layer 105 is higher than that of the air.

For the bonding layer 105, a resin that is curable at room temperature (e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 105 may also include a scattering member for scattering light. For example, the bonding layer 105 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

To sufficiently function as a scattering member, the particles preferably have a diameter larger than a visible light wavelength. Even if the diameter of primary particles is smaller than a visible light wavelength, secondary particles obtained by aggregation of the primary particles can be used as the scattering member. Specifically, the diameter of the particles is preferably greater than or equal to 0.05 µm and less than or equal to 5 µm, further preferably greater than or equal to 0.1 µm and less than or equal to 2 µm. Further, the diameter of the particles is preferably smaller than half the thickness of the bonding layer 105.

The bonding layer 105 preferably includes the scattering member so as to have a haze value of 50% or less, preferably 30% or less, further preferably 10% or less.

The mixture ratio of the particles to the resin can be adjusted as appropriate depending on the refractive index of the resin and the diameter and the refractive index of the particles, and can be higher than or equal to 1 wt % and lower than or equal to 10 wt %, for example.

In a light-emitting device, a plurality of reflective conductive films of light-emitting elements are arranged at regular intervals. Light-emitting devices with improved resolution may have a pixel density (resolution) of 250 ppi or more or, further, 300 ppi or more. When, accordingly, reflective conductive films are arranged at short regular intervals, external light reflected by the conductive films causes a stripe pattern on the screen by diffraction grating. There is also a problem in that the view of the outside is reflected by the conductive films to appear on the screen.

When the bonding layer 105 includes a scattering member, even when external light is reflected by an electrode of the light-emitting element, the reflected light is scattered when it passes through the bonding layer 105. This can make a stripe pattern less likely to be caused on the screen in the light-emitting device of one embodiment of the present invention and also reduce reflection of the view of the outside.

Further, when the bonding layer 105 includes a scattering member, light can be scattered at a position closer to a color filter as compared with the case where a component for scattering light is provided on the outer side of the substrate 103. This makes it possible to prevent unclear display of the light-emitting device due to blur of light extracted from the light-emitting element. Specifically, a layer including a scattering member is preferably provided in a region within 100 µm, preferably 10 µm, further preferably 1 µm from the color filter toward the light extraction side. This makes it possible to prevent unclear display of the light-emitting device due to blur of emitted light.

Such a structure in which the bonding layer 105 includes a scattering member is particularly preferable for a high-resolution light-emitting device in which adjacent light-emitting elements are close to each other and reflected light is likely to cause a stripe pattern on the screen, specifically, a light-emitting device with a resolution of 250 ppi or more, 256 ppi or more, or 300 ppi or more.

The insulator 107 can be formed using any of the organic resins that can be used for the substrate 103 and the bonding layer 105, or an inorganic insulating material. The insulator 107 does not necessarily have a light-transmitting property. Note that when the insulator 107 covers the substrate 103 on the light extraction side of the light-emitting device as in FIG. 2C, an insulating material with a light-transmitting property is used for the insulator 107. The substrate 103 and the insulator 107 may be attached to each other with an adhesive or the like.

The power storage device 111 includes a storage battery or a capacitor having a function of storing electricity. For example, the power storage device 111 includes a secondary battery such as a lithium secondary battery (e.g., a lithium polymer battery using a gel electrolyte), a lithium ion battery, a nickel-hydride battery, a nickel-cadmium battery, an organic radical battery, a lead-acid battery, an air secondary battery, a nickel-zinc battery, or a silver-zinc battery, or a capacitor with a large capacitance (e.g., a multilayer ceramic capacitor or an electric double layer capacitor).

The protective layer 115 can be formed using a material similar to that of the substrate 103, for example. The protective layer 115 does not necessarily have a light-transmitting property. It is also possible to use a thin metal material or a thin alloy material for the protective layer 115.

As described above, in the light-emitting device of one embodiment of the present invention, at least part of the substrate is bent to the element layer side; thus, the light-emitting device is less likely to be broken. Further, since an organic resin or the like is used for the substrate, the light-emitting device can be lightweight. Thus, with one embodiment of the present invention, a light-emitting device with high portability can be provided.

Moreover, in the light-emitting device of one embodiment of the present invention, the bonding layer 105 includes a scattering member; thus, reflected light can be prevented from causing a stripe pattern on the screen. Although it is also possible to provide a circularly polarizing plate or the like to prevent a stripe pattern from being caused, providing a circularly polarizing plate greatly reduces the amount of light extracted from the light-emitting element. In that case, the luminance of the light-emitting element must be increased so that required luminance of the light-emitting device is obtained, which results in increased power consumption of the light-emitting device. In one embodiment of the present invention, a stripe pattern can be prevented from being caused, without a decrease in the amount of light extracted from the light-emitting element. Thus, with one embodiment of the present invention, a light-emitting device with high light extraction efficiency and low power consumption can be provided.

This embodiment can be combined with any other embodiment as appropriate.

Embodiment 2

In this embodiment, a light-emitting device of one embodiment of the present invention is described with reference to FIGS. 3A and 3B, FIGS. 4A and 4B, FIGS. 5A and 5B, FIGS. 6A and 6B, FIGS. 7A to 7C, and FIGS. 8A to 8C.

Specific Example 1

Figure 3A:
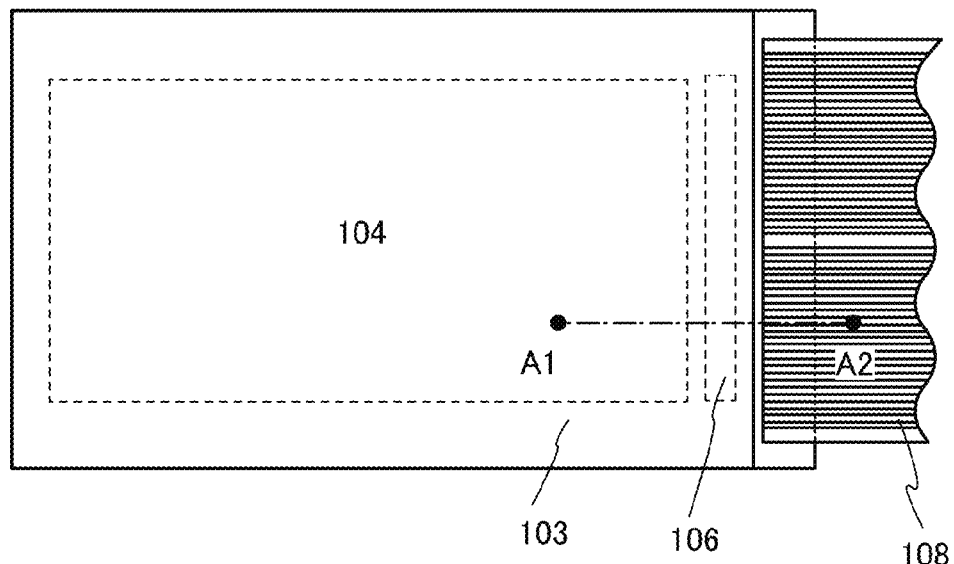
FIGS. 3A and 3B illustrate an example of a light-emitting device of one embodiment of the present invention.
Figure 3B:
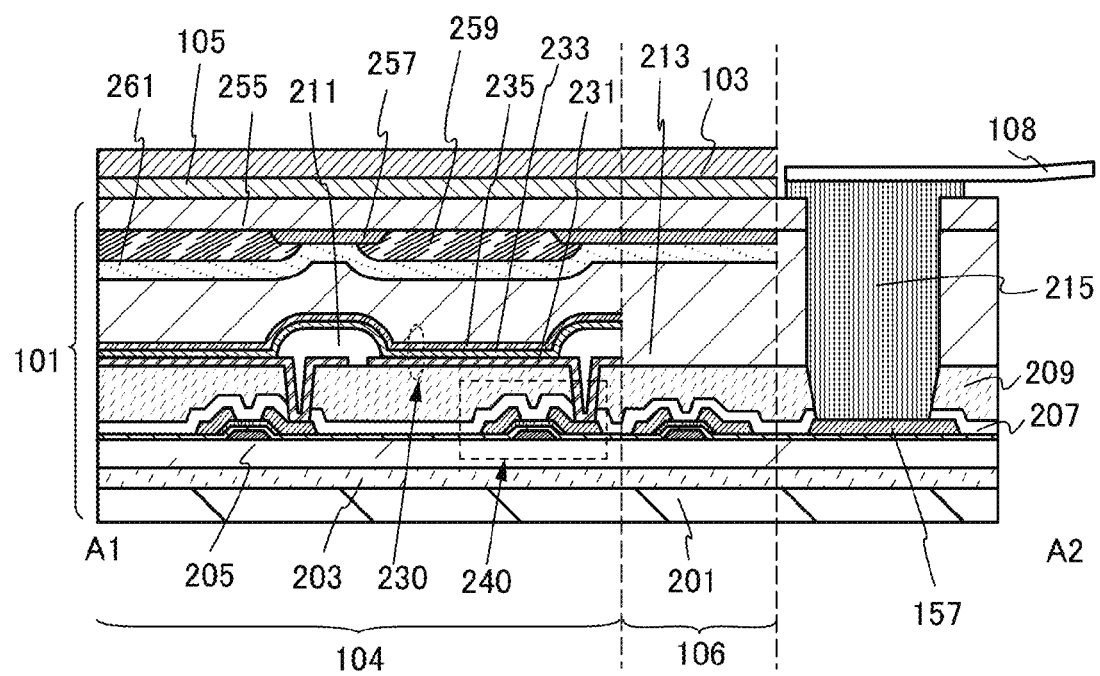

FIG. 3A is a plan view of the light-emitting device 150 (FIG. 2B) described as an example in Embodiment 1, and FIG. 3B is an example of a cross-sectional view taken along dashed-dotted line A1-A2 in FIG. 3A.

The light-emitting device shown in FIG. 3B includes the element layer 101, the bonding layer 105, and the substrate 103. The element layer 101 includes a substrate 201, a bonding layer 203, an insulating layer 205, a plurality of transistors, a conductive layer 157, an insulating layer 207, an insulating layer 209, a plurality of light-emitting elements, an insulating layer 211, a sealing layer 213, an insulating layer 261, a coloring layer 259, a light-blocking layer 257, and an insulating layer 255.

The conductive layer 157 is electrically connected to the FPC 108 via a connector 215.

A light-emitting element 230 includes a lower electrode 231, an EL layer 233, and an upper electrode 235. The lower electrode 231 is electrically connected to a source electrode or a drain electrode of a transistor 240. An end portion of the lower electrode 231 is covered with the insulating layer 211. The light-emitting element 230 has a top emission structure. The upper electrode 235 has a light-transmitting property and transmits light emitted from the EL layer 233.

The coloring layer 259 is provided to overlap with the light-emitting element 230, and the light-blocking layer 257 is provided to overlap with the insulating layer 211. The coloring layer 259 and the light-blocking layer 257 are covered with the insulating layer 261. The space between the light-emitting element 230 and the insulating layer 261 is filled with the sealing layer 213.

The light-emitting device includes a plurality of transistors including the transistor 240 in the light extraction portion 104 and the driver circuit portion 106. The transistor 240 is provided over the insulating layer 205. The insulating layer 205 and the substrate 201 are attached to each other with the bonding layer 203. The insulating layer 255 and the substrate 103 are attached to each other with the bonding layer 105. It is preferable to use films with low water permeability for the insulating layer 205 and the insulating layer 255, in which case an impurity such as water can be prevented from entering the light-emitting element 230 or the transistor 240, leading to improved reliability of the light-emitting device. The bonding layer 203 can be formed using a material similar to that of the bonding layer 105.

The light-emitting device in Specific Example 1 can be manufactured in the following manner: the insulating layer 205, the transistor 240, and the light-emitting element 230 are formed over a formation substrate with high heat resistance; the formation substrate is separated; and the insulating layer 205, the transistor 240, and the light-emitting element 230 are transferred to the substrate 201 and attached thereto with the bonding layer 203. The light-emitting device in Specific Example 1 can be manufactured in the following manner: the insulating layer 255, the coloring layer 259, and the light-blocking layer 257 are formed over a formation substrate with high heat resistance; the formation substrate is separated; and the insulating layer 255, the coloring layer 259, and the light-blocking layer 257 are transferred to the substrate 103 and attached thereto with the bonding layer 105.

In the case where a material with low heat resistance (e.g., resin) is used for a substrate, it is difficult to expose the substrate to high temperature in the manufacturing process. Thus, there is a limitation on conditions for forming a transistor and an insulating film over the substrate. Further, in the case where a material with high water permeability (e.g., resin) is used for a substrate of a light-emitting device, it is preferable to expose the substrate to high temperature and form a film with low water permeability between the substrate and a light-emitting element. In the manufacturing method of this embodiment, a transistor and the like can be formed over a formation substrate having high heat resistance; thus, the substrate can be exposed to high temperature and a highly reliable transistor and an insulating film with sufficiently low water permeability can be formed. Then, the transistor and the insulating film are transferred to a substrate with low heat resistance, whereby a highly reliable light-emitting device can be manufactured. Thus, with one embodiment of the present invention, a thin or/and light-weight light-emitting device with high reliability can be provided. Details of the manufacturing method will be described later.

The substrate 103 and the substrate 201 are each preferably formed using a material with high toughness. Thus, a light-emitting device with high impact resistance that is less likely to be broken can be provided. For example, when the substrate 103 is an organic resin substrate and the substrate 201 is a substrate formed using a thin metal material or a thin alloy material, the light-emitting device can be more lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the light-emitting device. The thickness of a substrate using a metal material or an alloy material is preferably greater than or equal to 10 µm and less than or equal to 200 µm, further preferably greater than or equal to 20 µm and less than or equal to 50 µm.

Further, when a material with high thermal emissivity is used for the substrate 201, the surface temperature of the light-emitting device can be prevented from rising, leading to prevention of breakage or a decrease in reliability of the light-emitting device. For example, the substrate 201 may have a stacked structure of a metal substrate and a layer with high thermal emissivity (the layer can be formed using a metal oxide or a ceramic material, for example).

Specific Example 2

Figure 4A:
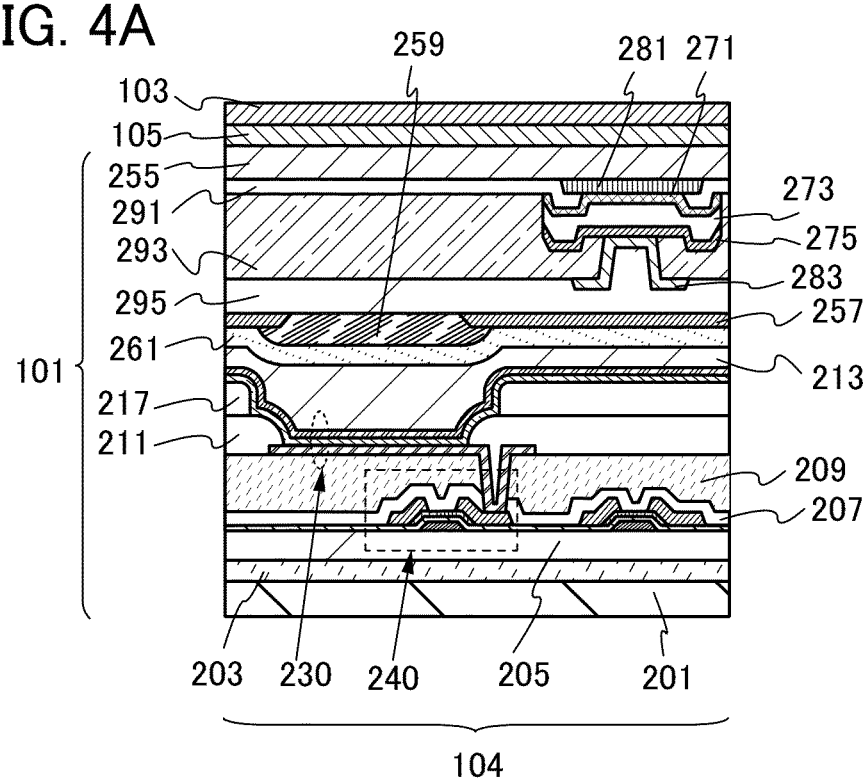
FIGS. 4A and 4B each illustrate an example of a light-emitting device of one embodiment of the present invention.

FIG. 4A shows another example of the light extraction portion 104 in the light-emitting device of one embodiment of the present invention. The light-emitting device shown in FIG. 4A is capable of touch operation. In the following specific examples, description of components similar to those in Specific Example 1 is omitted.

The light-emitting device shown in FIG. 4A includes the element layer 101, the bonding layer 105, and the substrate 103. The element layer 101 includes the substrate 201, the bonding layer 203, the insulating layer 205, a plurality of transistors, the insulating layer 207, the insulating layer 209, a plurality of light-emitting elements, the insulating layer 211, an insulating layer 217, the sealing layer 213, the insulating layer 261, the coloring layer 259, the light-blocking layer 257, a plurality of light-receiving elements, a conductive layer 281, a conductive layer 283, an insulating layer 291, an insulating layer 293, an insulating layer 295, and the insulating layer 255.

Specific Example 2 includes the insulating layer 217 over the insulating layer 211. The space between the substrate 103 and the substrate 201 can be adjusted with the insulating layer 217.

FIG. 4A shows an example in which a light-receiving element is provided between the insulating layer 255 and the sealing layer 213. Since the light-receiving element can be placed to overlap with a non-light-emitting region (e.g., a region where the light-emitting element is not provided, such as a region where a transistor or a wiring is provided) of the light-emitting device, the light-emitting device can be provided with a touch sensor without a decrease in the aperture ratio of a pixel (light-emitting element).

As the light-receiving element included in the light-emitting device of one embodiment of the present invention, for example, a pn photodiode or a pin photodiode can be used. In this embodiment, a pin photodiode including a p-type semiconductor layer 271, an i-type semiconductor layer 273, and an n-type semiconductor layer 275 is used as the light-receiving element.

Note that the i-type semiconductor layer 273 is a semiconductor in which the concentration of each of an impurity imparting p-type conductivity and an impurity imparting n-type conductivity is $1 \times 10^{20}$ cm$^{-3}$ or less and which has photoconductivity 100 times or more as high as dark conductivity. The i-type semiconductor layer 273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 273 includes, in its category, a semiconductor to which an impurity element imparting p-type conductivity is added intentionally or unintentionally at the time of deposition or after the deposition.

The light-blocking layer 257 is closer to the substrate 201 than is the light-receiving element and overlaps with the light-receiving element. The light-blocking layer 257 between the light-receiving element and the sealing layer 213 can prevent the light-receiving element from being irradiated with light emitted from the light-emitting element 230.

The conductive layer 281 and the conductive layer 283 are electrically connected to the light-receiving element. The conductive layer 281 preferably transmits light incident on the light-receiving element. The conductive layer 283 preferably blocks light incident on the light-receiving element.

It is preferable to provide an optical touch sensor between the substrate 103 and the sealing layer 213 because the optical touch sensor is less likely to be affected by light emitted from the light-emitting element 230 and can have improved S/N ratio.

Specific Example 3

Figure 4B:
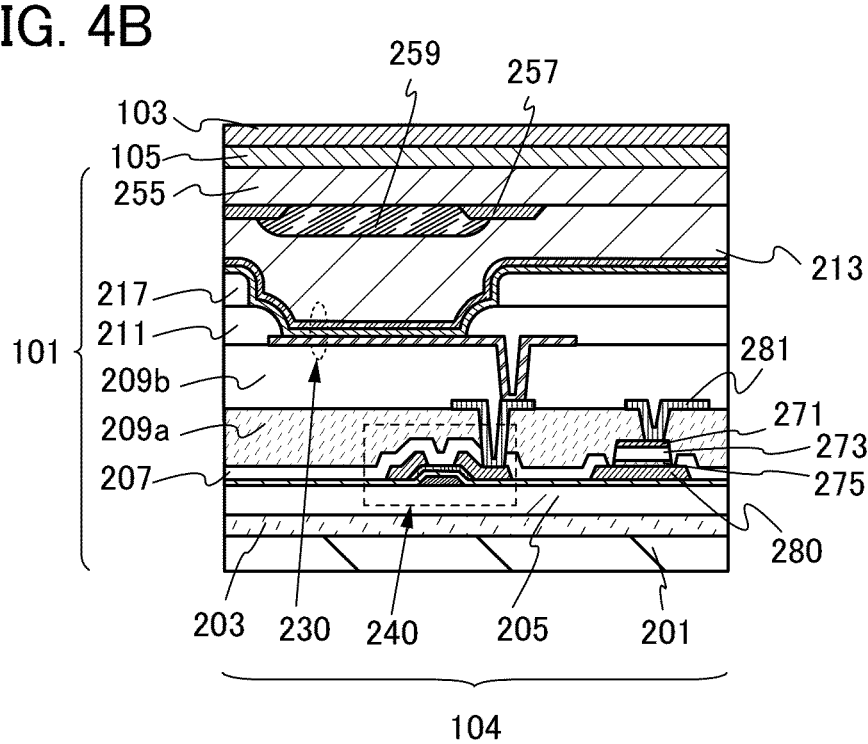

FIG. 4B shows another example of the light extraction portion 104 in the light-emitting device of one embodiment of the present invention. The light-emitting device shown in FIG. 4B is capable of touch operation.

The light-emitting device shown in FIG. 4B includes the element layer 101, the bonding layer 105, and the substrate 103. The element layer 101 includes the substrate 201, the bonding layer 203, the insulating layer 205, a plurality of transistors, the insulating layer 207, an insulating layer 209a, an insulating layer 209b, a plurality of light-emitting elements, the insulating layer 211, the insulating layer 217, the sealing layer 213, the coloring layer 259, the light-blocking layer 257, a plurality of light-receiving elements, a conductive layer 280, the conductive layer 281, and the insulating layer 255.

FIG. 4B shows an example in which a light-receiving element is provided between the insulating layer 205 and the sealing layer 213. Since the light-receiving element is provided between the insulating layer 205 and the sealing layer 213, a conductive layer to which the light-receiving element is electrically connected and a photoelectric conversion layer included in the light-receiving element can be formed using the same materials and the same steps as a conductive layer and a semiconductor layer included in the transistor 240. Thus, the light-emitting device capable of touch operation can be manufactured without a significant increase in the number of manufacturing steps.

Specific Example 4

Figure 5A:
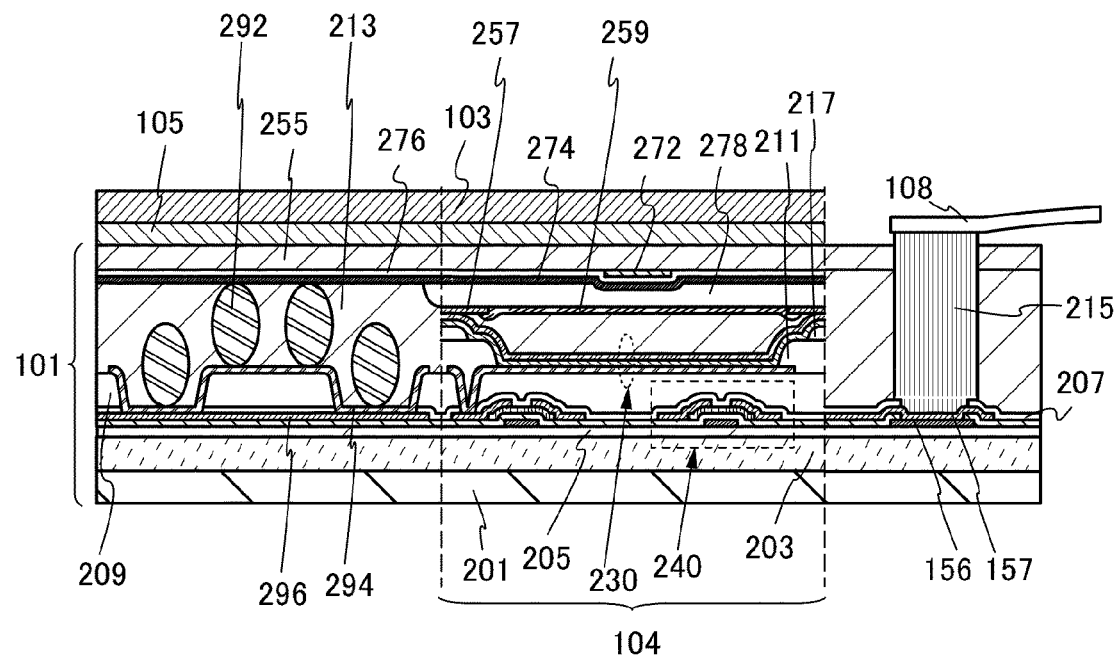
FIGS. 5A and 5B each illustrate an example of a light-emitting device of one embodiment of the present invention.

FIG. 5A shows another example of a light-emitting device of one embodiment of the present invention. The light-emitting device shown in FIG. 5A is capable of touch operation.

The light-emitting device shown in FIG. 5A includes the element layer 101, the bonding layer 105, and the substrate 103. The element layer 101 includes the substrate 201, the bonding layer 203, the insulating layer 205, a plurality of transistors, a conductive layer 156, the conductive layer 157, the insulating layer 207, the insulating layer 209, a plurality of light-emitting elements, the insulating layer 211, the insulating layer 217, the sealing layer 213, the coloring layer 259, the light-blocking layer 257, the insulating layer 255, a conductive layer 272, a conductive layer 274, an insulating layer 276, an insulating layer 278, a conductive layer 294, and a conductive layer 296.

FIG. 5A shows an example in which a capacitive touch sensor is provided between the insulating layer 255 and the sealing layer 213. The capacitive touch sensor includes the conductive layer 272 and the conductive layer 274.

The conductive layer 156 and the conductive layer 157 are electrically connected to the FPC 108 via the connector 215. The conductive layer 294 and the conductive layer 296 are electrically connected to the conductive layer 274 via conductive particles 292. Thus, the capacitive touch sensor can be driven via the FPC 108.

Specific Example 5

Figure 5B:
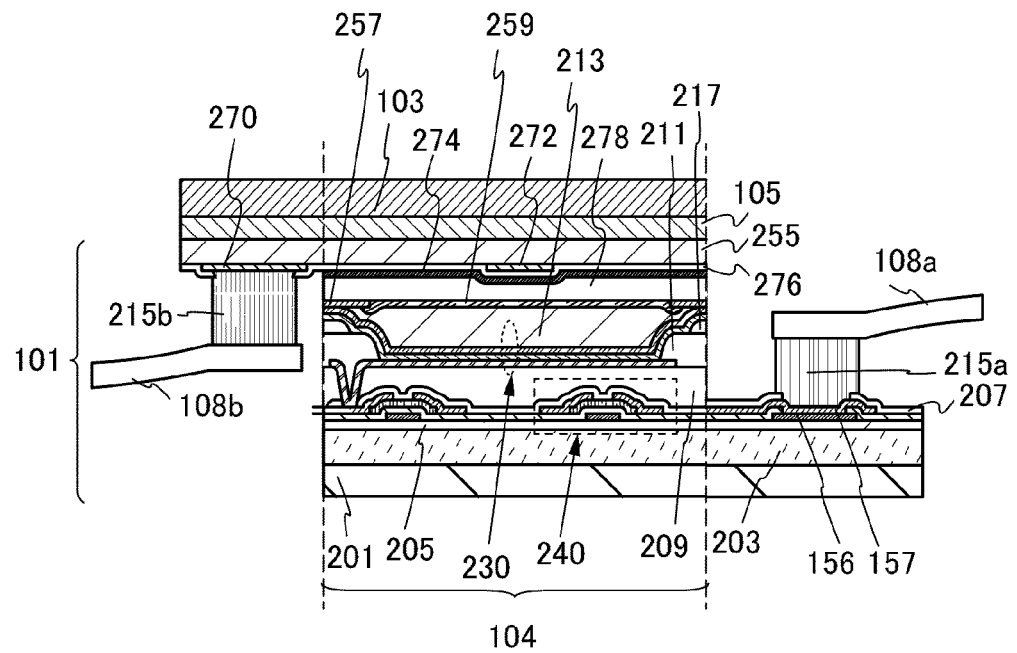

FIG. 5B shows another example of a light-emitting device of one embodiment of the present invention. The light-emitting device shown in FIG. 5B is capable of touch operation.

The light-emitting device shown in FIG. 5B includes the element layer 101, the bonding layer 105, and the substrate 103. The element layer 101 includes the substrate 201, the bonding layer 203, the insulating layer 205, a plurality of transistors, the conductive layer 156, the conductive layer 157, the insulating layer 207, the insulating layer 209, a plurality of light-emitting elements, the insulating layer 211, the insulating layer 217, the sealing layer 213, the coloring layer 259, the light-blocking layer 257, the insulating layer 255, a conductive layer 270, the conductive layer 272, the conductive layer 274, the insulating layer 276, and the insulating layer 278.

FIG. 5B shows an example in which a capacitive touch sensor is provided between the insulating layer 255 and the sealing layer 213. The capacitive touch sensor includes the conductive layer 272 and the conductive layer 274.

The conductive layer 156 and the conductive layer 157 are electrically connected to an FPC 108a via a connector 215a. The conductive layer 270 is electrically connected to an FPC 108b via a connector 215b. Thus, the light-emitting element 230 and the transistor 240 can be driven via the FPC 108a, and the capacitive touch sensor can be driven via the FPC 108b.

Specific Example 6

Figure 6A:
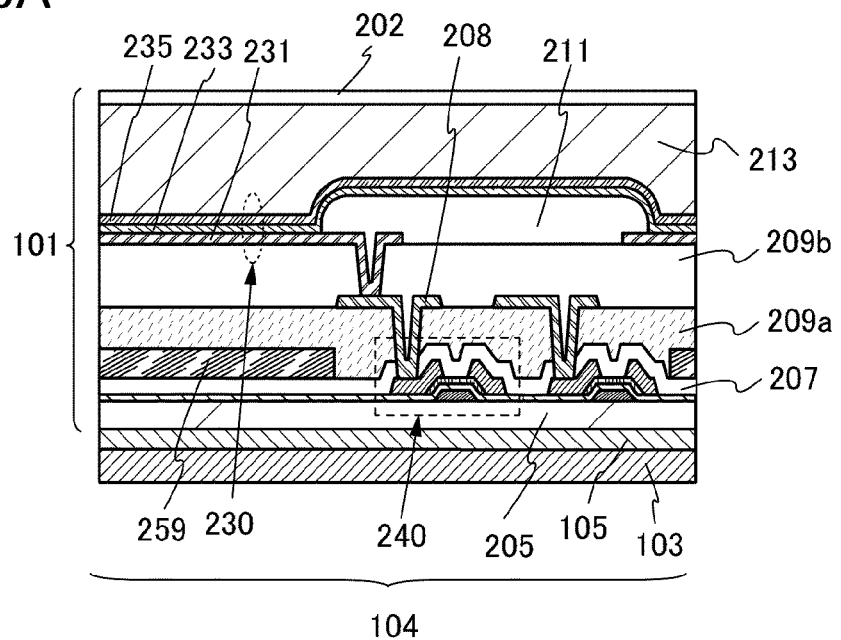
FIGS. 6A and 6B each illustrate an example of a light-emitting device of one embodiment of the present invention.

FIG. 6A shows another example of the light extraction portion 104 in the light-emitting device of one embodiment of the present invention.

The light-emitting device shown in FIG. 6A includes the element layer 101, the substrate 103, and the bonding layer 105. The element layer 101 includes a substrate 202, the insulating layer 205, a plurality of transistors, the insulating layer 207, a conductive layer 208, the insulating layer 209a, the insulating layer 209b, a plurality of light-emitting elements, the insulating layer 211, the sealing layer 213, and the coloring layer 259.

The light-emitting element 230 includes the lower electrode 231, the EL layer 233, and the upper electrode 235. The lower electrode 231 is electrically connected to the source electrode or the drain electrode of the transistor 240 via the conductive layer 208. An end portion of the lower electrode 231 is covered with the insulating layer 211. The light-emitting element 230 has a bottom emission structure. The lower electrode 231 has a light-transmitting property and transmits light emitted from the EL layer 233.

The coloring layer 259 is provided to overlap with the light-emitting element 230, and light emitted from the light-emitting element 230 is extracted from the substrate 103 side through the coloring layer 259. The space between the light-emitting element 230 and the substrate 202 is filled with the sealing layer 213. The substrate 202 can be formed using a material similar to that of the substrate 201.

Specific Example 7

Figure 6B:
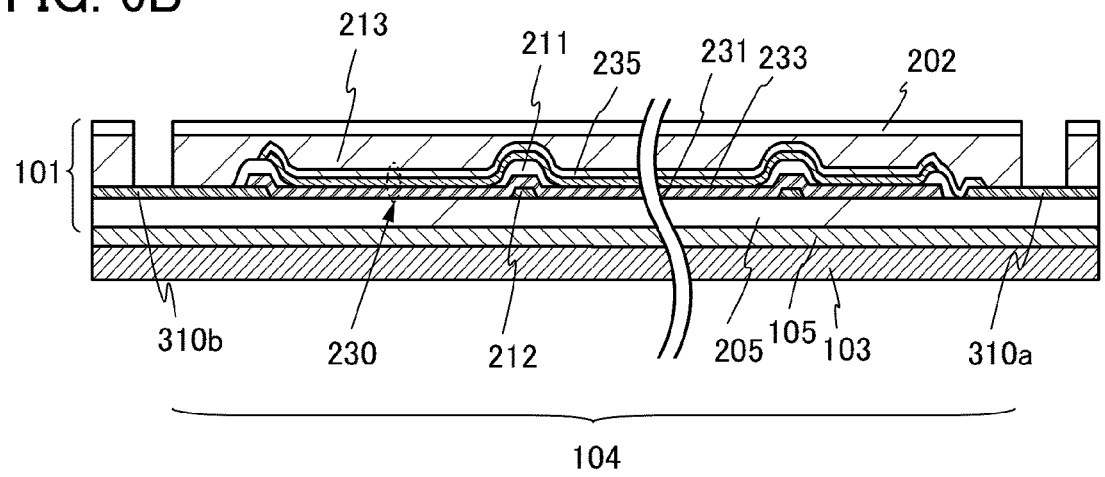

FIG. 6B shows another example of a light-emitting device of one embodiment of the present invention.

The light-emitting device shown in FIG. 6B includes the element layer 101, the bonding layer 105, and the substrate 103. The element layer 101 includes the substrate 202, the insulating layer 205, a conductive layer 310a, a conductive layer 310b, a plurality of light-emitting elements, the insulating layer 211, a conductive layer 212, and the sealing layer 213.

The conductive layer 310a and the conductive layer 310b, which are external connection electrodes of the light-emitting device, can each be electrically connected to an FPC or the like.

The light-emitting element 230 includes the lower electrode 231, the EL layer 233, and the upper electrode 235. An end portion of the lower electrode 231 is covered with the insulating layer 211. The light-emitting element 230 has a bottom emission structure. The lower electrode 231 has a light-transmitting property and transmits light emitted from the EL layer 233. The conductive layer 212 is electrically connected to the lower electrode 231.

The substrate 103 may have, as a light extraction structure, a hemispherical lens, a micro lens array, a film provided with an uneven surface structure, a light diffusing film, or the like. For example, the substrate 103 with a light extraction structure can be formed by attaching the above lens or film to a resin substrate with an adhesive or the like having substantially the same refractive index as the substrate or the lens or film.

The conductive layer 212 is preferably, though not necessarily, provided because voltage drop due to the resistance of the lower electrode 231 can be prevented. In addition, for a similar purpose, a conductive layer electrically connected to the upper electrode 235 may be provided over the insulating layer 211, the EL layer 233, the upper electrode 235, or the like.

The conductive layer 212 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 212 can be, for example, greater than or equal to 0.1 µm and less than or equal to 3 µm, preferably greater than or equal to 0.1 µm and less than or equal to 0.5 µm.

When a paste (e.g., silver paste) is used as a material for the conductive layer electrically connected to the upper electrode 235, metal particles forming the conductive layer aggregate; therefore, the surface of the conductive layer is rough and has many gaps. Thus, even when the conductive layer is formed over the insulating layer 211, for example, it is difficult for the EL layer 233 to completely cover the conductive layer; accordingly, the upper electrode and the conductive layer are electrically connected to each other easily, which is preferable.

<Examples of Materials>

Next, materials and the like that can be used for a light-emitting device of one embodiment of the present invention are described. Description on the substrate 103 and the bonding layer 105 is omitted because the description in Embodiment 1 can be referred to. Further, description on the components already described in this embodiment is also omitted.

The structure of the transistors in the light-emitting device is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the light-emitting device includes a pair of electrodes (the lower electrode 231 and the upper electrode 235); and the EL layer 233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 231 and the upper electrode 235, holes are injected to the EL layer 233 from the anode side and electrons are injected to the EL layer 233 from the cathode side. The injected electrons and holes are recombined in the EL layer 233 and a light-emitting substance contained in the EL layer 233 emits light.

The EL layer 233 includes at least a light-emitting layer. In addition to the light-emitting layer, the EL layer 233 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 233, either a low molecular compound or a high molecular compound can be used, and an inorganic compound may also be used. Each of the layers included in the EL layer 233 can be formed by any of the following methods: an evaporation method (including a vacuum evaporation method), a transfer method, a printing method, an inkjet method, a coating method, and the like.

The insulating layer 205 and the insulating layer 255 can each be formed using an inorganic insulating material. It is particularly preferable to use the insulating film with low water permeability, in which case a highly reliable light-emitting device can be provided.

The insulating layer 207 has an effect of preventing diffusion of impurities into a semiconductor included in the transistor. As the insulating layer 207, an inorganic insulating film such as a silicon oxide film, a silicon oxynitride film, a silicon nitride film, a silicon nitride oxide film, or an aluminum oxide film can be used.

As each of the insulating layers 209, 209a, and 209b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may have a stacked structure of any of insulating films formed of these materials and inorganic insulating films.

The insulating layer 211 is provided to cover an end portion of the lower electrode 231. In order that the insulating layer 211 be favorably covered with the EL layer 233 and the upper electrode 235 formed thereover, a side wall of the insulating layer 211 preferably has a tilted surface with continuous curvature.

As a material for the insulating layer 211, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 211.

There is no particular limitation to the method for forming the insulating layer 211; a photolithography method, a sputtering method, an evaporation method, a droplet discharging method (e.g., an inkjet method), a printing method (e.g., a screen printing method or an off-set printing method), or the like may be used.

The insulating layer 217 can be formed using an inorganic insulating material, an organic insulating material, or the like. As the organic insulating material, for example, a negative or positive photosensitive resin, a non-photosensitive resin, or the like can be used. Instead of the insulating layer 217, a conductive layer may be formed. For example, the conductive layer can be formed using a metal material such as titanium or aluminum. When a conductive layer is used instead of the insulating layer 217 and the conductive layer is electrically connected to the upper electrode 235, voltage drop due to the resistance of the upper electrode 235 can be prevented. The insulating layer 217 may have either a tapered shape or an inverse tapered shape.

Each of the insulating layers 276, 278, 291, 293, and 295 can be formed using an inorganic insulating material or an organic insulating material. It is particularly preferable to use an insulating film with a planarization function for each of the insulating layers 278 and 295 in order to reduce surface unevenness due to a sensor element.

For the sealing layer 213, a resin that is curable at room temperature (e.g., a two-component-mixture-type resin), a light curable resin, a thermosetting resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 213. In the case where light emitted from the light-emitting element 230 is extracted outside through the sealing layer 213, the sealing layer 213 preferably includes a filler with a high refractive index or a scattering member. Materials for the drying agent, the filler with a high refractive index, and the scattering member are similar to those that can be used for the bonding layer 105.

Each of the conductive layers 156, 157, 294, and 296 can be formed using the same material and the same step as a conductive layer included in the transistor or the light-emitting element. The conductive layer 280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 208, 212, 310a, and 310b can also be formed using any of the above metal materials, alloy materials, and conductive metal oxides.

Each of the conductive layers 272, 274, 281, and 283 is a conductive layer with a light-transmitting property. The conductive layer can be formed using, for example, indium oxide, ITO, indium zinc oxide, zinc oxide, zinc oxide to which gallium is added, or the like. The conductive layer 270 can be formed using the same material and the same step as the conductive layer 272.

As the conductive particles 292, particles of an organic resin, silica, or the like coated with a metal material are used. It is preferable to use nickel or gold as the metal material because contact resistance can be reduced. It is also preferable to use particles each coated with layers of two or more kinds of metal materials, such as particles coated with nickel and further with gold.

For the connector 215, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 257 is provided between the adjacent coloring layers 259. The light-blocking layer 257 blocks light emitted from the adjacent light-emitting element, thereby preventing color mixture between adjacent pixels. Here, the coloring layer 259 is provided such that its end portion overlaps with the light-blocking layer 257, whereby light leakage can be reduced. The light-blocking layer 257 can be formed using a material that blocks light emitted from the light-emitting element, for example, a metal material, a resin material including a pigment or a dye, or the like. Note that the light-blocking layer 257 is preferably provided in a region other than the light extraction portion 104, such as the driver circuit portion 106, as illustrated in FIG. 3B, in which case undesired leakage of guided light or the like can be prevented.

The insulating layer 261 covering the coloring layer 259 and the light-blocking layer 257 is preferably provided because it can prevent an impurity such as a pigment included in the coloring layer 259 or the light-blocking layer 257 from diffusing into the light-emitting element or the like. For the insulating layer 261, a light-transmitting material is used, and an inorganic insulating material or an organic insulating material can be used. The insulating film with low water permeability may be used for the insulating layer 261. Note that the insulating layer 261 is not necessarily provided.

<Example of Manufacturing Method>

Next, an example of a method for manufacturing a light-emitting device of one embodiment of the present invention will be described with reference to FIGS. 7A to 7C and FIGS. 8A to 8C. Here, the manufacturing method is described using the light-emitting device of Specific Example 1 (FIG. 3B) as an example.

Figure 7A:
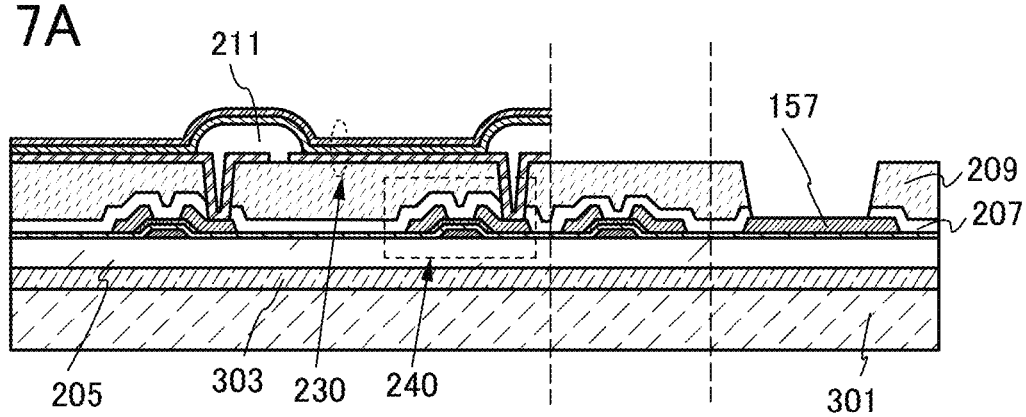
FIGS. 7A to 7C illustrate an example of a method for manufacturing a light-emitting device of one embodiment of the present invention.

First, a separation layer 303 is formed over a formation substrate 301, and the insulating layer 205 is formed over the separation layer 303. Next, the plurality of transistors, the conductive layer 157, the insulating layer 207, the insulating layer 209, the plurality of light-emitting elements 230, and the insulating layer 211 are formed over the insulating layer 205. An opening is formed in the insulating layers 211, 209, and 207 to expose the conductive layer 157 (FIG. 7A).

Figure 7B:
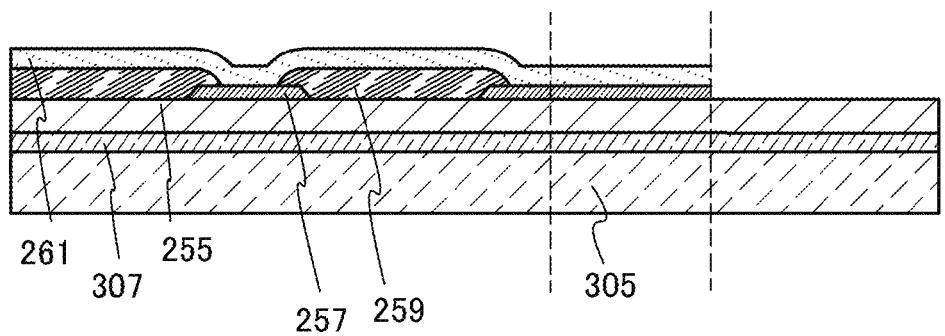

In addition, a separation layer 307 is formed over a formation substrate 305, and the insulating layer 255 is formed over the separation layer 307. Next, the light-blocking layer 257, the coloring layer 259, and the insulating layer 261 are formed over the insulating layer 255 (FIG. 7B).

The formation substrate 301 and the formation substrate 305 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Note that when containing a large amount of barium oxide (BaO), the glass substrate can be heat-resistant and more practical. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 303 and the separation layer 307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide (N$_2$O) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 7C:
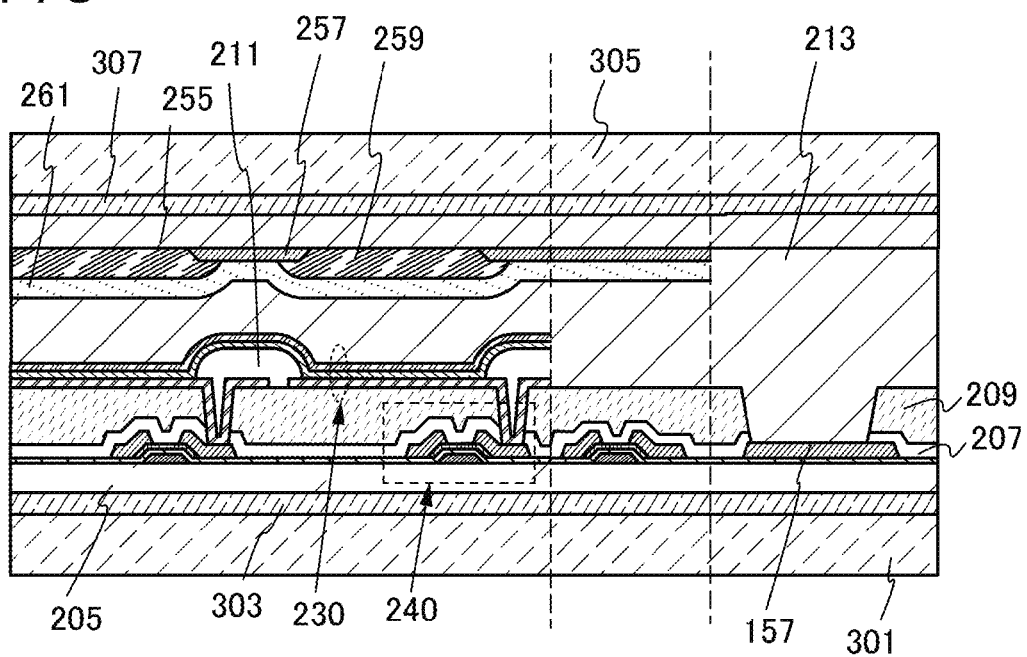

Then, a material for the sealing layer 213 is applied to a surface of the formation substrate 305 over which with the coloring layer 259 and the like are formed or a surface of the formation substrate 301 over which the light-emitting element 230 and the like are formed, and the formation substrate 301 and the formation substrate 305 are attached so that these two surfaces face each other with the sealing layer 213 positioned therebetween (FIG. 7C).

Next, the formation substrate 301 is separated, and the exposed insulating layer 205 and the substrate 201 are attached to each other with the bonding layer 203. Further, the formation substrate 305 is separated, and the exposed insulating layer 255 and the substrate 103 are attached to each other with the bonding layer 105. Although the substrate 103 does not overlap with the conductive layer 157 in FIG. 8A, the substrate 103 may overlap with the conductive layer 157.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as NF$_3$, BrF$_3$, or ClF$_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as NF$_3$, BrF$_3$, or ClF$_3$, or the like. In this case, the separation layer is not necessarily provided.

Further, the separation process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by filling the interface between the separation layer and the layer to be separated with a liquid. Further, the separation may be conducted while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 8A:
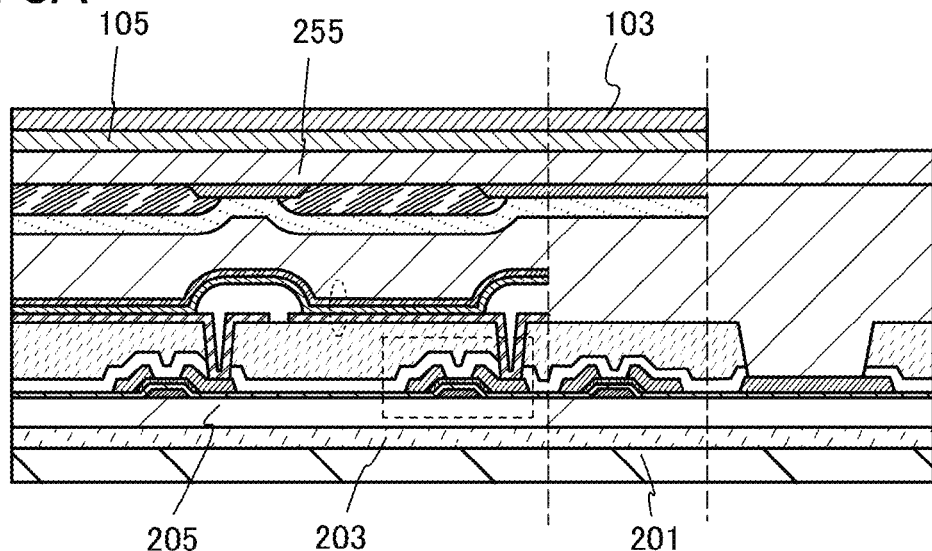
FIGS. 8A to 8C illustrate an example of a method for manufacturing a light-emitting device of one embodiment of the present invention.
Figure 8B:
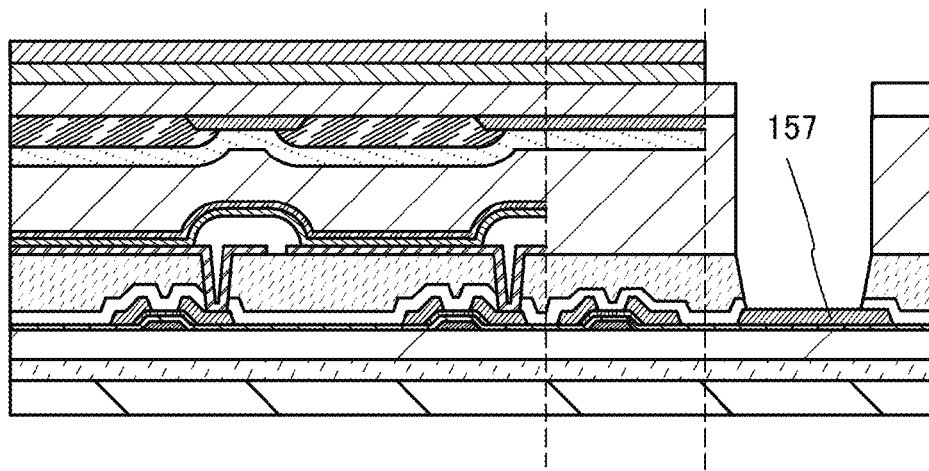
Figure 8C:
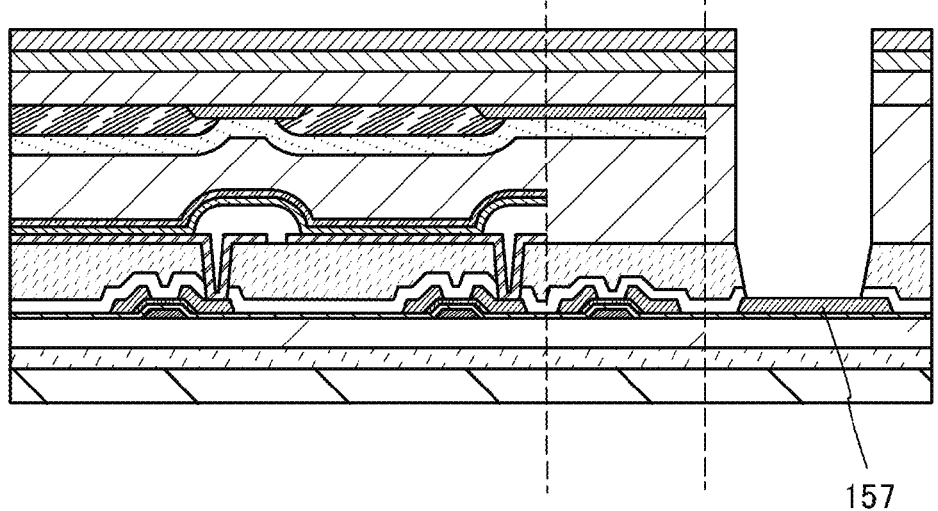
Figure 13A:
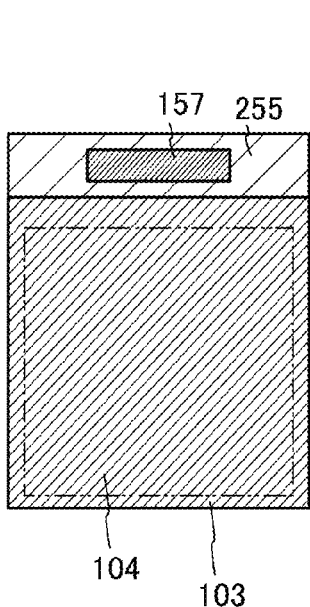
FIGS. 13A to 13F illustrate examples of light-emitting devices.

Lastly, an opening is formed in the insulating layer 255 and the sealing layer 213 to expose the conductive layer 157 (FIG. 8B). FIG. 13A is a plan view at this stage. In the case where the substrate 103 overlaps with the conductive layer 157, the opening is formed also in the substrate 103 and the bonding layer 105 so that the conductive layer 157 is exposed (FIG. 8C). The method for forming the opening is not particularly limited and may be, for example, a laser ablation method, an etching method, an ion beam sputtering method, or the like. As another method, a cut may be made in a film over the conductive layer 157 with a sharp knife or the like and part of the film may be separated by physical force.

In the above-described manner, the light-emitting device of one embodiment of the present invention can be manufactured.

As described above, a light-emitting device of one embodiment of the present invention includes two substrates; one is the substrate 103 and the other is the substrate 201 or the substrate 202. The light-emitting device can be formed with two substrates even when including a touch sensor. Owing to the use of the minimum number of substrates, improvement in light extraction efficiency and improvement in clarity of display can be easily achieved.

This embodiment can be combined with any other embodiment as appropriate.

Embodiment 3

In this embodiment, a light-emitting device of one embodiment of the present invention will be described with reference to FIG. 9.

Figure 9:
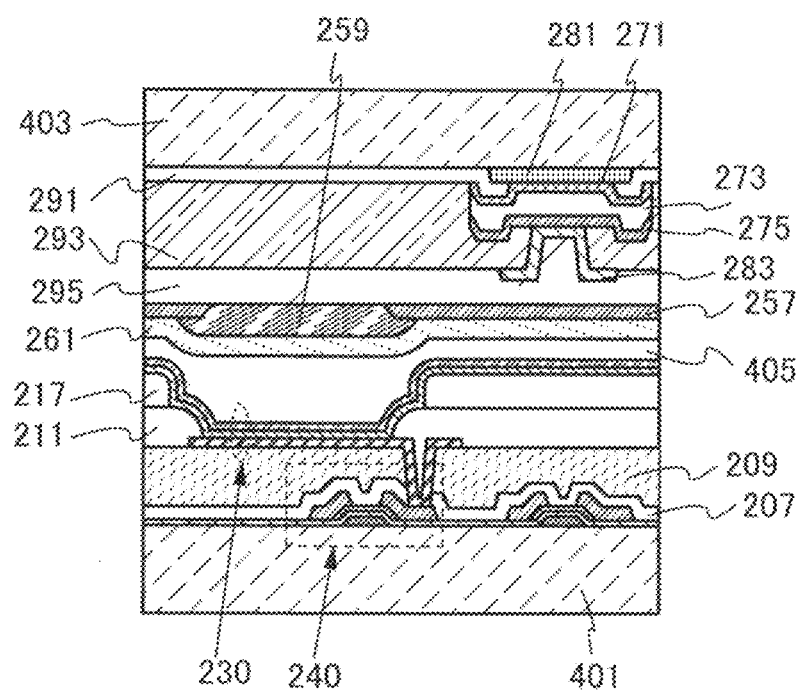
FIG. 9 illustrates an example of a light-emitting device of one embodiment of the present invention.

The light-emitting device shown in FIG. 9 includes a substrate 401, the transistor 240, the light-emitting element 230, the insulating layer 207, the insulating layer 209, the insulating layer 211, the insulating layer 217, a space 405, the insulating layer 261, the light-blocking layer 257, the coloring layer 259, a light-receiving element (including the p-type semiconductor layer 271, the i-type semiconductor layer 273, and the n-type semiconductor layer 275), the conductive layer 281, the conductive layer 283, the insulating layer 291, the insulating layer 293, the insulating layer 295, and a substrate 403.

The light-emitting device includes a bonding layer (not shown) formed in a frame shape between the substrate 401 and the substrate 403 to surround the light-emitting element 230 and the light-receiving element. The light-emitting element 230 is sealed by the bonding layer, the substrate 401, and the substrate 403.

In the light-emitting device of this embodiment, the substrate 403 has a light-transmitting property. Light emitted from the light-emitting element 230 is extracted to the air through the coloring layer 259, the substrate 403, and the like.

The light-emitting device of this embodiment is capable of touch operation. Specifically, proximity or contact of an object on a surface of the substrate 403 can be sensed with the light-receiving element.

An optical touch sensor is highly durable and preferable because its sensing accuracy is not affected by damage to a surface that is touched by an object. An optical touch sensor is also advantageous in that it is capable of noncontact sensing, it does not degrade the clarity of images when used in a display device, and it is applicable to large-sized light-emitting devices and display devices.

It is preferable to provide an optical touch sensor between the substrate 403 and the space 405 because the optical touch sensor is less likely to be affected by light emitted from the light-emitting element 230 and can have improved S/N ratio.

The light-blocking layer 257 is closer to the substrate 401 than is the light-receiving element and overlaps with the light-receiving element. The light-blocking layer 257 can prevent the light-receiving element from being irradiated with light emitted from the light-emitting element 230.

There is no particular limitation on materials used for the substrates 401 and 403. The substrate through which light emitted from the light-emitting element is extracted is formed using a material that transmits the light. For example, a material such as glass, quartz, ceramics, sapphire, or an organic resin can be used. Since the substrate through which light is not extracted does not need a light-transmitting property, a metal substrate or the like using a metal material or an alloy material can be used as well as the above-mentioned substrates. Further, any of the materials for the substrates given in the above embodiments can also be used for the substrates 401 and 403.

A method for sealing the light-emitting device is not limited, and either solid sealing or hollow sealing can be employed. For example, as a sealing material, a glass material such as a glass frit, or a resin material such as a resin that is curable at room temperature (e.g., a two-component-mixture-type resin), a light curable resin, or a thermosetting resin can be used. The space 405 may be filled with an inert gas such as nitrogen or argon, or with a resin or the like similar to that used for the sealing layer 213. Further, the resin may include the drying agent, the filler with a high refractive index, or the scattering member.

This embodiment can be combined with any other embodiment as appropriate.

EXAMPLE

In this example, a light-emitting device of one embodiment of the present invention is described.

In this example, first, the element layer 101, the bonding layer 105, and the substrate 103 were stacked. The thickness of this stacked structure was 140 µm. Then, an end portion of the substrate 103 and an end portion of the element layer 101 were bent to the side opposite to the light extraction side of the light-emitting device. After that, the insulator 107 was provided. The insulator 107 covers side surfaces of the element layer 101, the substrate 103, and the bonding layer 105 to prevent entry of an impurity such as moisture to the element layer 101. Further, the insulator 107 increases the strength of a connection portion 119 between the element layer 101 and the FPC 108, thereby improving the reliability of the light-emitting device.

Figure 10A:
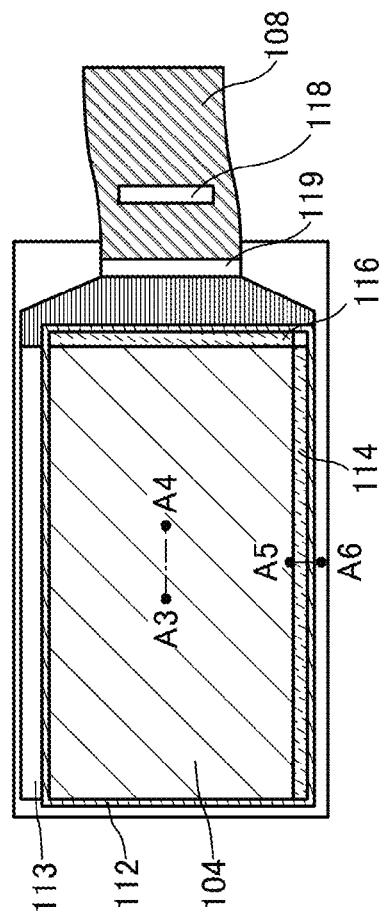
FIGS. 10A and 10B illustrate an example of a light-emitting device.
Figure 10B:
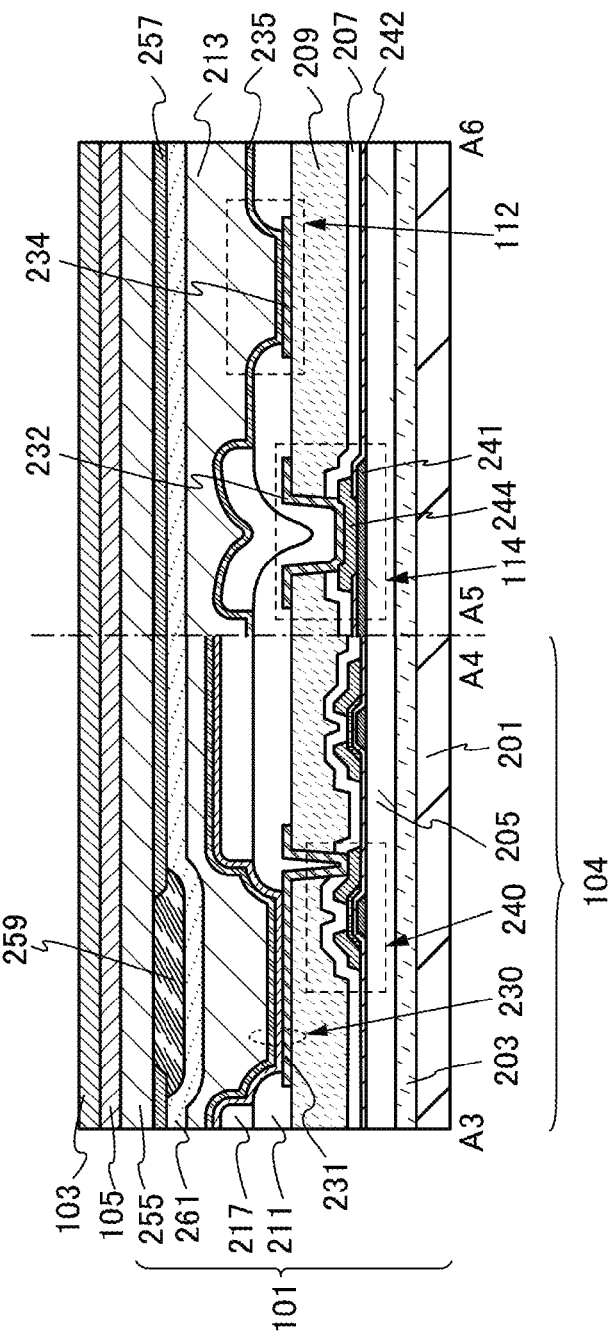

FIG. 10A is a plan view of the light-emitting device fabricated in this example. FIG. 10B is a cross-sectional view taken along dashed-dotted lines A3-A4 and A5-A6 in FIG. 10A.

Note that description on components of the light-emitting device in this example that are similar to those of Specific Example 2 (FIG. 4A) described in Embodiment 2 is omitted in some cases.

The light-emitting device in this example includes, as shown in FIG. 10A, the light extraction portion 104, a connection portion 112, a gate line driver circuit 113, a gate pad portion 114, a source pad portion 116, the connection portion 119, an IC 118 for a source line driver circuit, and the FPC 108.

Description on the structure of the light extraction portion 104 in FIG. 10B is omitted because the structure is similar to that in FIG. 4A.

In the connection portion 112 in FIG. 10B, a conductive layer 234 and the upper electrode 235 are stacked and electrically connected to each other. The conductive layer 234 is formed using the same material and the same step as the lower electrode 231 of the light-emitting element 230. The upper electrode 235 is connected to the conductive layer 234 in an opening in the insulating layer 211.

In the gate pad portion 114 in FIG. 10B, a gate line 241 that is formed using the same material and the same step as a gate electrode of the transistor 240, a conductive layer 244 that is formed using the same material and the same step as a source electrode and a drain electrode of the transistor 240, and a conductive layer 232 that is formed using the same material and the same step as the lower electrode 231 of the light-emitting element 230 are stacked and electrically connected to each other. The conductive layer 244 is connected to the gate line 241 in an opening in a gate insulating film 242. The conductive layer 232 is connected to the conductive layer 244 in an opening in the insulating layers 207 and 209.

The gate pad portion 114 at the end of a gate line and the source pad portion 116 at the end of a source line can be used for inspection of the transistor or failure analysis of the light-emitting device. For example, it is possible to check whether signals are properly input to the gate line from the gate line driver circuit 113 by using the gate pad portion 114.

The upper electrode 235 of the light-emitting element 230 is provided over the conductive layer 232 with the insulating layers 211 and 217 positioned therebetween. Here, when the insulating layers 211 and 217 are thin, the conductive layer 232 and the upper electrode 235 might be short-circuited. Therefore, the insulating layers that electrically insulate the conductive layer 232 and the upper electrode 235 are preferably thick enough.

Figure 11:
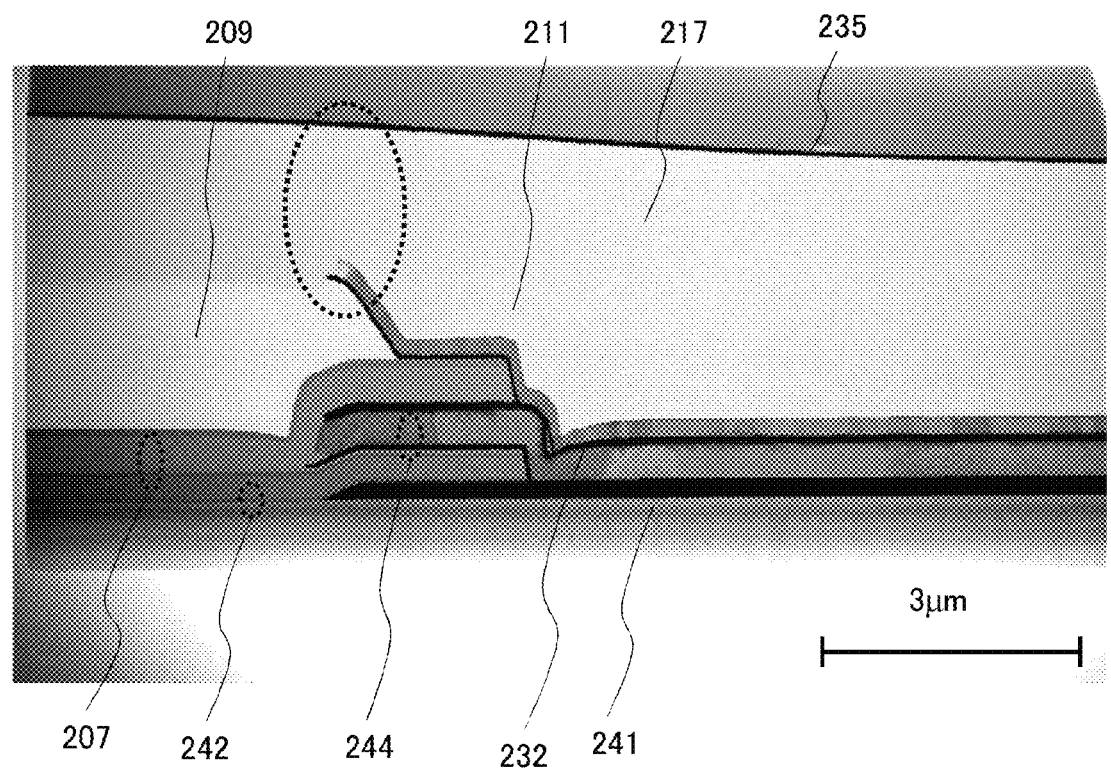
FIG. 11 is a photograph of a cross section of a gate pad portion in a light-emitting device in Example.

FIG. 11 shows a cross section of the gate pad portion 114 that is observed by scanning transmission electron microscopy (STEM).

As indicated by the region surrounded by a dotted line, the conductive layer 232 and the upper electrode 235 are electrically insulated by the stacked structure of the insulating layers 211 and 217. Thus, a short circuit between the conductive layer 232 and the upper electrode 235 is prevented and line defects in the light-emitting device can be reduced. Note that the insulating layers 211 and 217 are formed using the same material; therefore, the boundary between the insulating layers is not clear in FIG. 11. The insulating layers 211 and 217 may be formed using different materials.

Figure 12A:
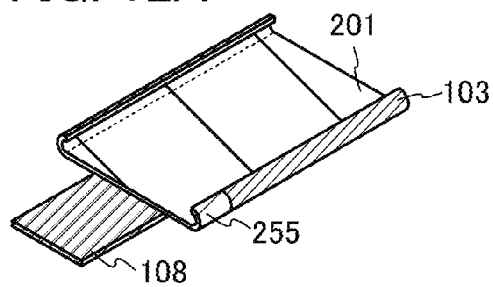
FIGS. 12A to 12E illustrate steps for manufacturing a light-emitting device in Example.
Figure 13B:
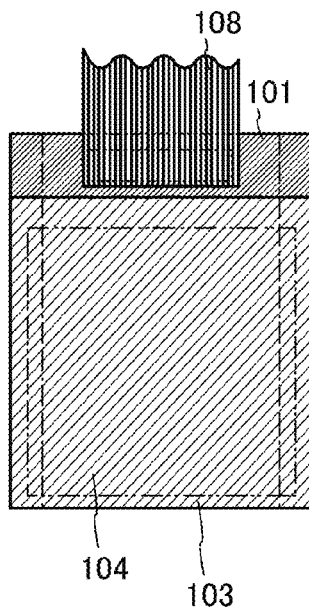

As shown in FIG. 12A, end portions of the light-emitting device (see FIGS. 10A and 10B) were bent to the element layer 101 side. As indicated by the dashed-dotted line in FIG. 13B, the bend lines are parallel to sides of the substrate. Here, end portions of the substrate 103, the bonding layer 105, and the element layer 101 were bent to the element layer 101 side. The curvature radius of a side surface of the light-emitting device was 4 mm. As shown in FIG. 13B, part of the light-emitting portion (light extraction portion 104) was bent to make the light-emitting device emit light from a side surface as well as the top surface.

Figure 13C:
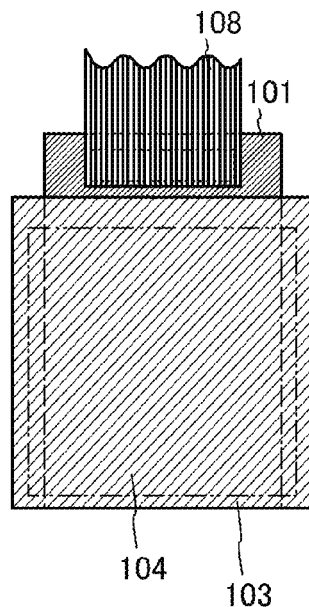

As shown in FIG. 13C, the width of a region of the element layer 101 that does not overlap with the substrate 103 may be smaller than that of the substrate 103 and end portions of the element layer 101 may be bent only in regions that overlap with the substrate 103. It is also possible to employ a structure in which the width of the whole element layer 101 is smaller than that of the substrate 103 and the element layer 101 is not bent.

Figure 13D:
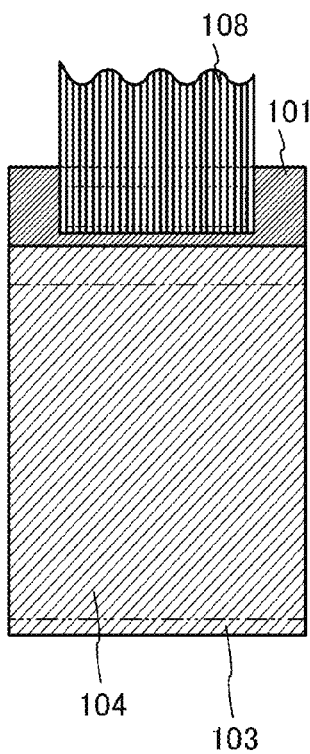

FIG. 13D is a plan view of the rear side of the light-emitting device in FIG. 12A (i.e., the light extraction side).

Figure 12B:
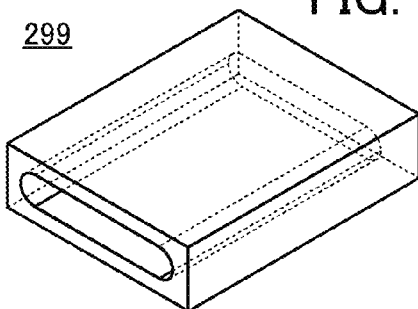
Figure 12C:
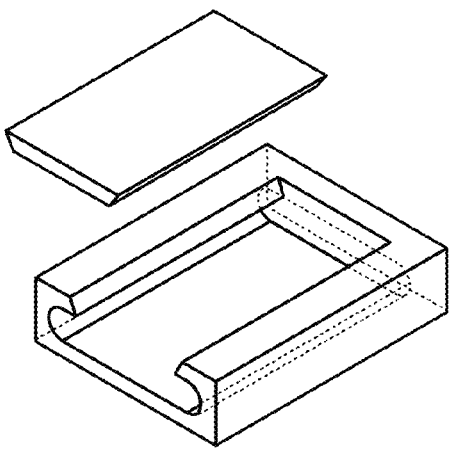

Then, the light-emitting device bent into the shape shown in FIG. 12A was put in a mold 299 shown in FIG. 12B and fixed. The mold is not necessarily composed of one member, and may be composed of a plurality of members as shown in FIG. 12C, for example.

Figure 12D:
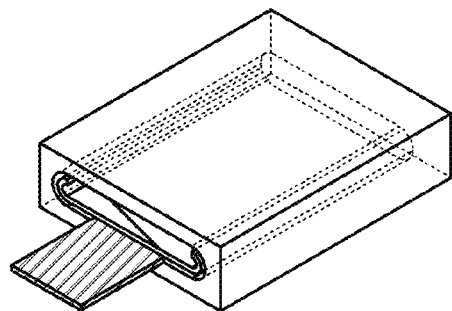

A resin was poured into the mold 299 with the light-emitting device kept in the mold 299 (FIG. 12D) and the resin was cured, whereby the insulator 107 was formed. In this example, an epoxy resin, which transmits visible light, was used as the resin.

The insulator 107 may be formed only on the bottom surface side of the element layer 101 (the side opposite to the light extraction side of the light-emitting device) as shown in FIG. 2A, or may also cover the light extraction surface of the light-emitting device as shown in FIG. 2C. For example, on the light extraction side of the light-emitting device, it is preferable that the insulator 107 not be formed in a region overlapping with the light extraction portion 104 in order to prevent a decrease in the light extraction efficiency of the light-emitting device.

For example, the insulator 107 can be prevented from being formed in the region overlapping with the light extraction portion 104 on the light extraction side of the light-emitting device in the following manner: the insulator 107 is formed with a separate film for protecting the surface provided on the substrate 103, and then the separate film is peeled off.

In addition, it is preferable to form the insulator 107 in a region overlapping with the connection portion 119 to increase the strength of a crimp portion of the FPC 108, which is on the light extraction side of the light-emitting device. Note that the strength of the crimp portion can be increased with a resin other than the insulator 107, a tape, or the like.

Figure 12E:
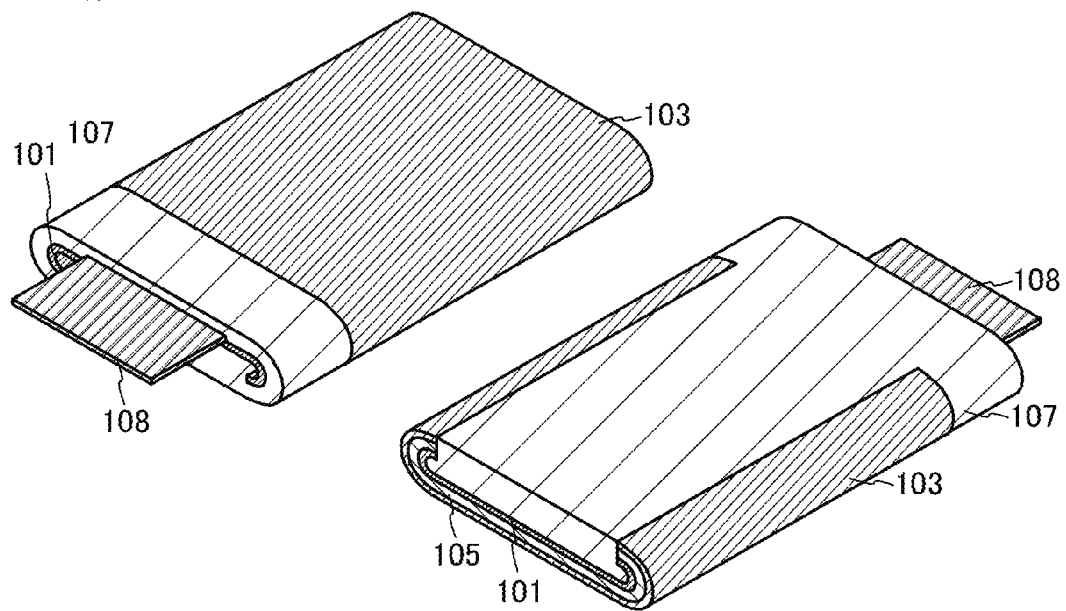

In the above manner, the light-emitting device of one embodiment of the present invention in which at least part of the substrate on the light extraction side of the light-emitting device is bent to the element layer side was fabricated (FIG. 12E).

Figure 13E:
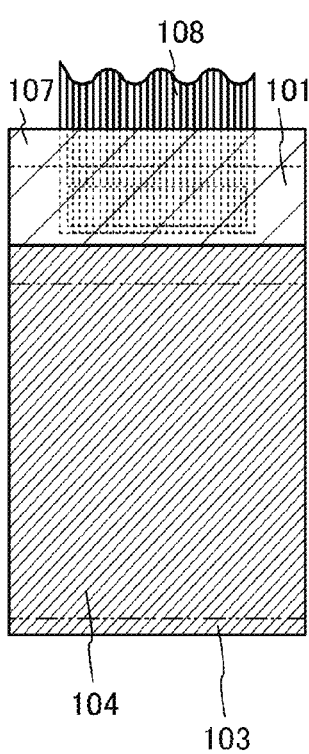
Figure 13F:
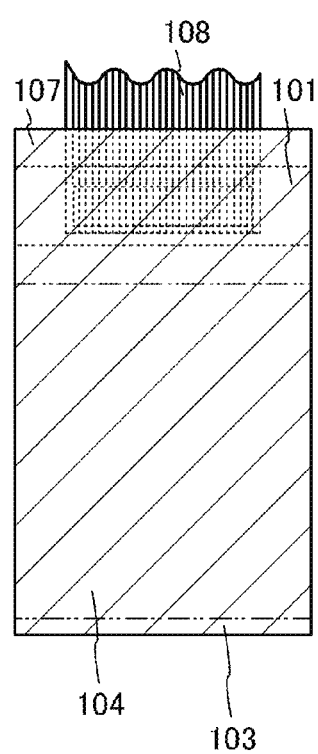

FIG. 13E is a plan view of the light extraction side of the light-emitting device in FIG. 12E. FIG. 13F is a plan view of the light extraction side of the light-emitting device showing the case where the insulator 107 covers the light extraction surface of the light-emitting device.

Figure 14A:
FIGS. 14A and 14B show photographs of a light-emitting device.
Figure 14B:
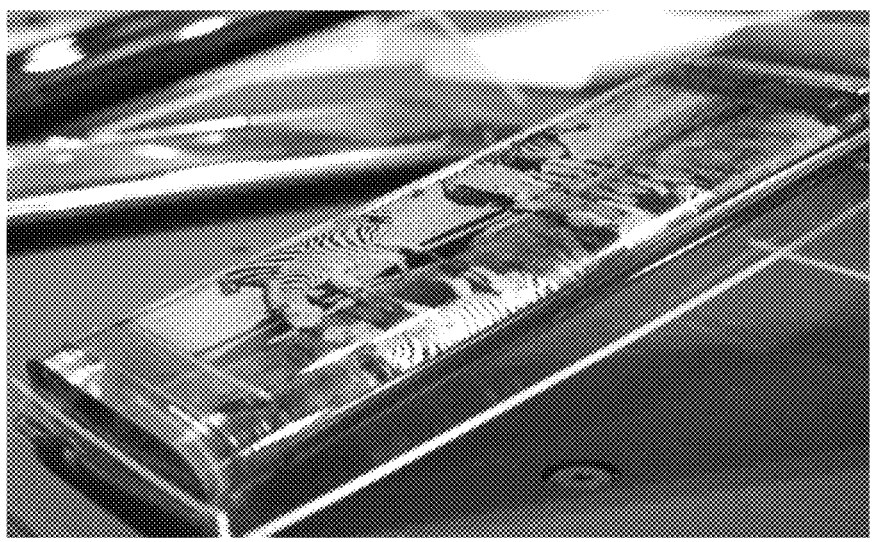

FIGS. 14A and 14B show a light-emitting device of one embodiment of the present invention that was fabricated. The thickness of the light-emitting device was 8000 μm.

It is also possible to make the light-emitting device of one embodiment of the present invention be able to be switched between display using a side surface and display not using a side surface (using only the front surface). The side surface and the front surface may display independent images or display one image; further, switching between these two modes is possible.

Figure 15A:
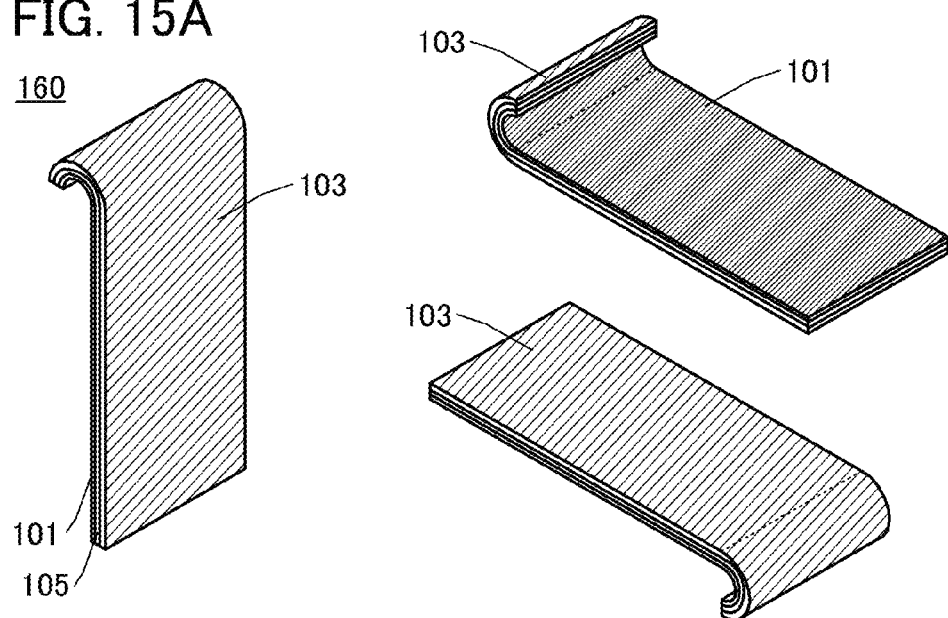
FIGS. 15A to 15D illustrate an example of a light-emitting device of one embodiment of the present invention.

FIGS. 15A to 15D illustrate an example in which an end portion including one side surface of the substrate 103 is bent to the element layer 101 side. FIG. 15A illustrates perspective views of a light-emitting device 160 of one embodiment of the present invention viewed from three directions.

Figure 15B:
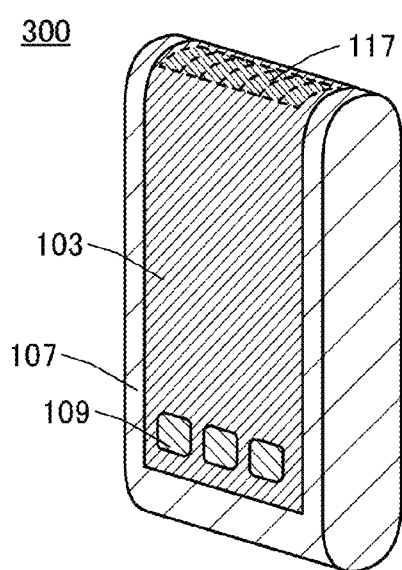
Figure 15C:
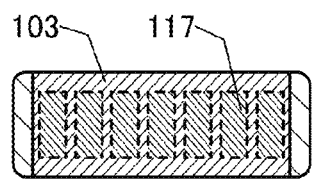
Figure 15D:
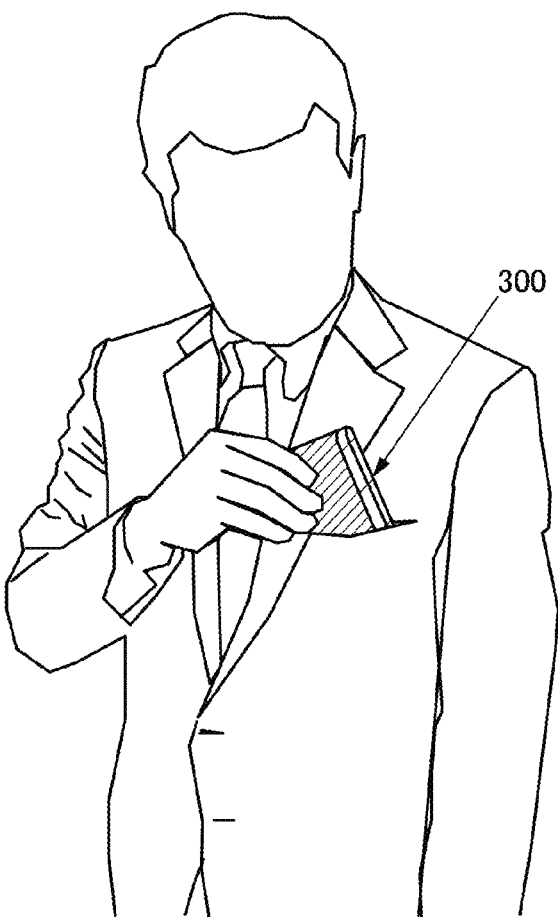

FIGS. 15B to 15D illustrate a portable information terminal 300 using such a light-emitting device. FIG. 15B is a perspective view illustrating an external shape of the portable information terminal 300. FIG. 15C is a top view of the portable information terminal 300. FIG. 15D illustrates a use state of the portable information terminal 300.

The portable information terminal 300 serves as one or more of a telephone set, an electronic notebook, an information browsing system, and the like, for example. Specifically, the portable information terminal 300 can be used as a smartphone.

Figure 17A:
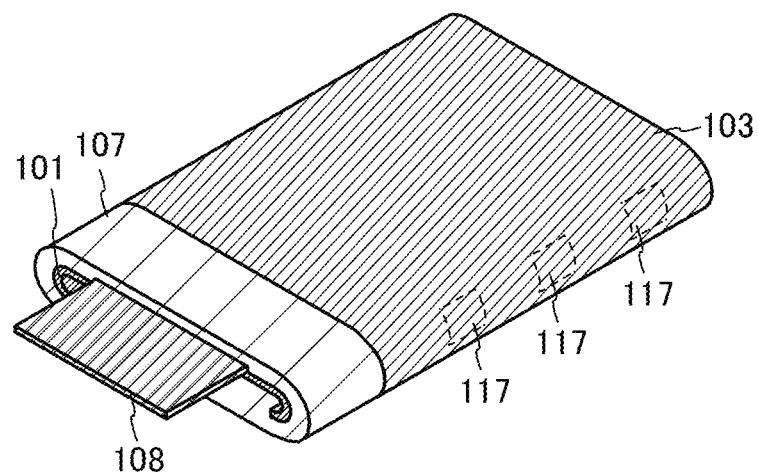
FIGS. 17A and 17B illustrate an example of a light-emitting device of one embodiment of the present invention.
Figure 17B:
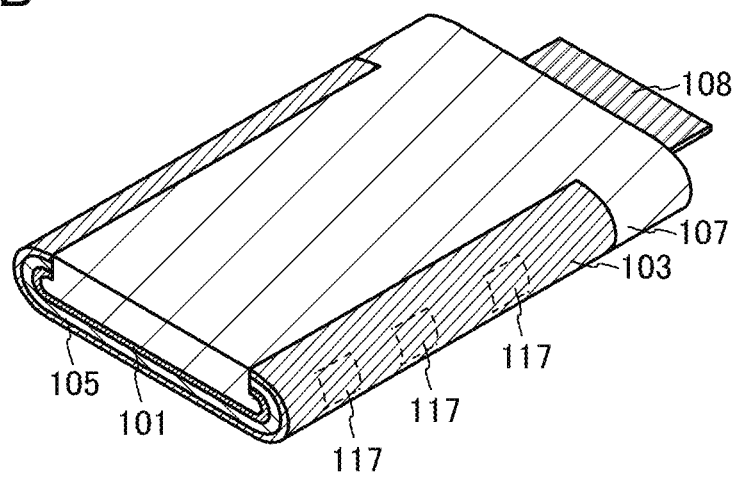

The portable information terminal 300 can display characters and image information on its plurality of surfaces. For example, three operation buttons 109 can be displayed on one surface (FIG. 15B). Further, information 117 indicated by dashed rectangles can be displayed on another surface (FIG. 15C). Examples of the information 117 include contents of notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button 109, an icon, or the like may be displayed in place of the information 117. Although FIGS. 15B and 15C show the example in which the information 117 is displayed at the top, one embodiment of the present invention is not limited thereto. For example, as shown in FIGS. 17A and 17B, the information may be displayed on the side.

Since the portable information terminal 300 can perform display on a side surface as shown in FIG. 15C, a user can see the display with the portable information terminal 300 put in a breast pocket of his/her clothes, for example (FIG. 15D).

Specifically, a caller's phone number, name, or the like of an incoming call is displayed in a position that can be observed from above the portable information terminal 300. Thus, the user can see the display without taking out the portable information terminal 300 from the pocket. Accordingly, the user can receive an incoming call when it is an urgent call or reject an incoming call when it is an unnecessary call.

Note that the portable information terminal 300 can be provided with a vibration sensor or the like and a memory device with a program for shifting a mode into an incoming call rejection mode in accordance with vibration sensed by the vibration sensor or the like. Thus, the user can shift the mode into the incoming call rejection mode by tapping the portable information terminal 300 over his/her clothes so as to apply vibration.

Figure 16A:
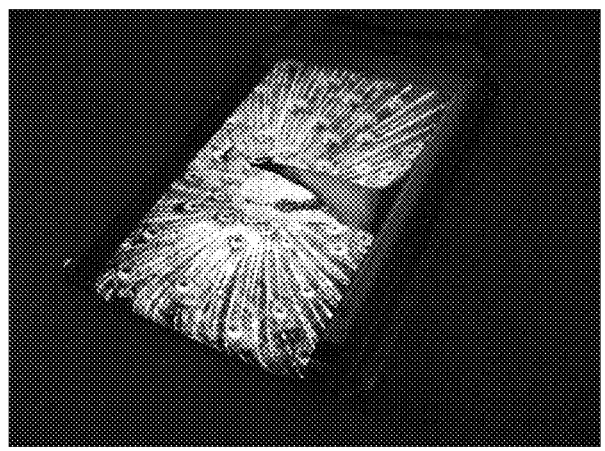
FIGS. 16A and 16B show photographs of a light-emitting device.
Figure 16B:
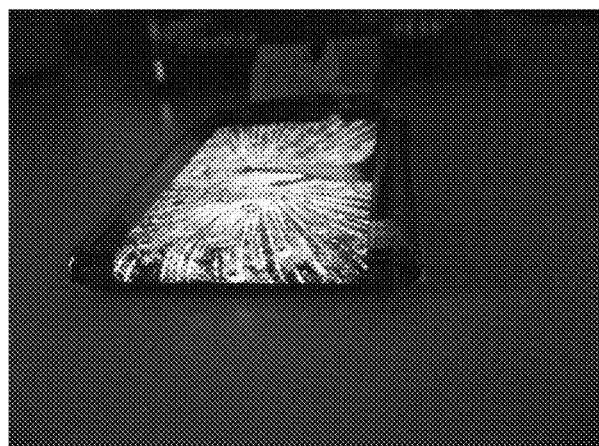

FIGS. 16A and 16B show a light-emitting device of one embodiment of the present invention that was fabricated. Note that the structures of the element layer 101, the bonding layer 105, and the substrate 103 are similar to those in FIGS. 10A and 10B.

EXPLANATION OF REFERENCE

100: light-emitting device, 101: element layer, 103: substrate, 104: light extraction portion, 105: bonding layer, 106: driver circuit portion, 107: insulator, 108: FPC, 108*a*: FPC, 108*b*: FPC, 109: operation button, 110: light-emitting device, 111: power storage device, 112: connection portion, 113: gate line driver circuit, 114: gate pad portion, 115: protective layer, 116: source pad portion, 117: information, 118: IC, 119: connection portion, 120: light-emitting device, 130: light-emitting device, 140: light-emitting device, 150: light-emitting device, 156: conductive layer, 157: conductive layer, 160: light-emitting device, 201: substrate, 202: substrate, 203: bonding layer, 205: insulating layer, 207: insulating layer, 208: conductive layer, 209: insulating layer, 209*a*: insulating layer, 209*b*: insulating layer, 211: insulating layer, 212: conductive layer, 213: sealing layer, 215: connector, 215*a*: connector, 215*b*: connector, 217: insulating layer, 230: light-emitting element, 231: lower electrode, 232: conductive layer, 233: EL layer, 234: conductive layer, 235: upper electrode, 240: transistor, 241: gate line, 242: gate insulating film, 244: conductive layer, 255: insulating layer, 257: light-blocking layer, 259: coloring layer, 261: insulating layer, 270: conductive layer, 271: p-type semiconductor layer, 272: conductive layer, 273: i-type semiconductor layer, 274: conductive layer, 275: n-type semiconductor layer, 276: insulating layer, 278: insulating layer, 280: conductive layer, 281: conductive layer, 283: conductive layer, 291: insulating layer, 292: conductive particle, 293: insulating layer, 294: conductive layer, 295: insulating layer, 296: conductive layer, 301: formation substrate, 303: separation layer, 305: formation substrate, 307: separation layer, 310*a*: conductive layer, 310*b*: conductive layer, 401: substrate, 403: substrate, 405: space.

This application is based on Japanese Patent Application serial no. 2013-084528 filed with Japan Patent Office on Apr. 15, 2013 and Japanese Patent Application serial no. 2013-218603 filed with Japan Patent Office on Oct. 21, 2013, the entire contents of which are hereby incorporated by reference.

The invention claimed is:

1. A smartphone comprising:
an element layer comprising a top surface side, a bottom surface side opposite to the top surface side, and a light-emitting element configured to emit light toward the top surface side;
a display portion comprising the light-emitting element;
a first transistor in the display portion, on the element layer;
a driver circuit comprising a second transistor on the element layer;
a flexible printed circuit adjacent to the driver circuit;
a touch sensor comprised in the element layer;
a substrate facing the top surface side of the element layer and attached to the element layer; and
an insulator on and in contact with the bottom surface side of the element layer, a side surface of the element layer, and a side surface of the substrate,
wherein the substrate has a light-transmitting property, and
wherein an end portion of the substrate is bent to an element layer side.

2. The smartphone according to claim 1, further comprising:
a bonding layer comprising a resin and a particle between the element layer and the substrate,
wherein the particle has a refractive index different from a refractive index of the resin.

3. The smartphone according to claim 1,
wherein the insulator covers a top surface side of the substrate.

4. The smartphone according to claim 1, further comprising:
a power storage device placed on the bottom surface side of the element layer.

5. The smartphone according to claim 1, further comprising:
  a power storage device placed on the bottom surface side of the element layer; and
  a protective layer covering the power storage device,
  wherein the protective layer covers a portion of the substrate bent to the element layer side.

6. The smartphone according to claim 5,
  wherein the protective layer overlaps with the element layer without any part of the substrate positioned therebetween.

7. The smartphone according to claim 1,
  wherein an external shape of the smartphone is fixed.

8. A smartphone comprising:
  an element layer comprising a top surface side, a bottom surface side opposite to the top surface side, and a light-emitting element configured to emit light toward the top surface side;
  a display portion comprising the light-emitting element;
  a first transistor in the display portion, on the element layer;
  a driver circuit comprising a second transistor on the element layer;
  a flexible printed circuit adjacent to the driver circuit;
  a touch sensor comprised in the element layer; and
  a substrate facing the top surface side of the element layer and attached to the element layer,
  wherein the substrate has a light-transmitting property,
  wherein an end portion of the element layer is above an end portion of the substrate, and
  wherein the end portion of the substrate and the end portion of the element layer are bent toward the bottom surface side of the element layer so that a first region of the element layer and a second region of the element layer face each other.

9. The smartphone according to claim 8, further comprising:
  a bonding layer comprising a resin and a particle between the element layer and the substrate,
  wherein the particle has a refractive index different from a refractive index of the resin.

10. The smartphone according to claim 8, further comprising:
  an insulator covering the bottom surface side of the element layer, a side surface of the element layer, and a side surface of the substrate.

11. The smartphone according to claim 10,
  wherein the insulator covers a top surface side of the substrate.

12. The smartphone according to claim 8, further comprising:
  a power storage device placed on the bottom surface side of the element layer.

13. The smartphone according to claim 8, further comprising:
  a power storage device placed on the bottom surface side of the element layer; and
  a protective layer covering the power storage device,
  wherein the protective layer covers a portion of the substrate bent to the element layer side.

14. The smartphone according to claim 13,
  wherein the protective layer overlaps with the element layer without any part of the substrate positioned therebetween.

15. The smartphone according to claim 8,
  wherein an external shape of the smartphone is fixed.

16. A smartphone comprising:
  an element layer comprising a top surface side, a bottom surface side opposite to the top surface side, and a light-emitting element configured to emit light toward the top surface side;
  a display portion comprising the light-emitting element;
  a first transistor in the display portion, on the element layer;
  a driver circuit comprising a second transistor on the element layer;
  a flexible printed circuit adjacent to the driver circuit;
  a touch sensor comprised in the element layer;
  a substrate facing the top surface side of the element layer and attached to the element layer; and
  an insulator on and in contact with the bottom surface side of the element layer, a side surface of the element layer, and a side surface of the substrate,
  wherein the substrate has a light-transmitting property, and
  wherein an end portion of the substrate and an end portion of the element layer are bent toward the bottom surface side of the element layer so that a first region of the element layer and a second region of the element layer face each other.

17. The smartphone according to claim 16, further comprising:
  a bonding layer comprising a resin and a particle between the element layer and the substrate,
  wherein the particle has a refractive index different from a refractive index of the resin.

18. The smartphone according to claim 16,
  wherein the insulator covers a top surface side of the substrate.

19. The smartphone according to claim 16, further comprising:
  a power storage device placed on the bottom surface side of the element layer.

20. The smartphone according to claim 16, further comprising:
  a power storage device placed on the bottom surface side of the element layer; and
  a protective layer covering the power storage device,
  wherein the protective layer covers a portion of the substrate bent to the element layer side.

21. The smartphone according to claim 20,
  wherein the protective layer overlaps with the element layer without any part of the substrate positioned therebetween.

22. The smartphone according to claim 16,
  wherein an external shape of the smartphone is fixed.

* * * * *

UNITED STATES PATENT AND TRADEMARK OFFICE
CERTIFICATE OF CORRECTION

PATENT NO. : 9,848,070 B2
APPLICATION NO. : 15/164057
DATED : December 19, 2017
INVENTOR(S) : Shunpei Yamazaki et al.

It is certified that error appears in the above-identified patent and that said Letters Patent is hereby corrected as shown below:

In the Claims

In Claim 1, at Column 28, Line 37, "alight-emitting" should be --a light-emitting--.

Signed and Sealed this
Third Day of April, 2018

Andrei Iancu
*Director of the United States Patent and Trademark Office*